United States Patent
Hasegawa et al.

(10) Patent No.: US 11,990,407 B2
(45) Date of Patent: May 21, 2024

(54) SEMICONDUCTOR DEVICE AND WIRING STRUCTURE

(71) Applicant: KIOXIA CORPORATION, Tokyo (JP)

(72) Inventors: Tomohiro Hasegawa, Tokyo (JP); Kouji Nakao, Yokohama Kanagawa (JP); Hiroshi Nasu, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/056,684

(22) Filed: Nov. 17, 2022

(65) Prior Publication Data

US 2023/0085775 A1    Mar. 23, 2023

Related U.S. Application Data

(63) Continuation of application No. 17/183,813, filed on Feb. 24, 2021, now Pat. No. 11,532,555.

(30) Foreign Application Priority Data

Sep. 11, 2020    (JP) .................................. 2020-153060

(51) Int. Cl.
*H01L 23/528* (2006.01)
*H01L 23/522* (2006.01)
*H01L 27/02* (2006.01)

(52) U.S. Cl.
CPC ........ *H01L 23/528* (2013.01); *H01L 23/5226* (2013.01); *H01L 27/0207* (2013.01)

(58) Field of Classification Search
CPC .......................... H01L 23/528; H01L 23/5226; H01L 27/0207

(Continued)

(56) References Cited

U.S. PATENT DOCUMENTS 9,337,087 B1    5/2016    Zhang et al.
2006/0081991 A1    4/2006    Seta
(Continued)

FOREIGN PATENT DOCUMENTS

JP    2006-114763 A    4/2006
JP    2006-228770 A    8/2006
JP    2010021277 A    1/2010

OTHER PUBLICATIONS

Office Action mailed Dec. 19, 2023 in corresponding Japanese Patent Application 2020-153060, 7 pages (with English Translation).

*Primary Examiner* — Tu-Tu V Ho
(74) *Attorney, Agent, or Firm* — Kim & Stewart LLP

(57) ABSTRACT

A semiconductor device includes first and second wiring layers, and first and second via plugs. The first wiring layer has parallel tracks along which wirings are laid out, the tracks including first and second outer tracks and an inner track between the first and second outer tracks, the wirings including a first line laid out along the first outer track and having an end portion that is laid out along the first outer track, and a second line laid out along the inner track and having an end portion that is laid out along the first outer track. The first via plug is in contact with the end portion of the first line and extends between the first and second wiring layers, and the second via plug is in contact with the end portion of the second line and extends between the first and second wiring layers.

14 Claims, 14 Drawing Sheets

(58) Field of Classification Search
USPC .......................................................... 257/774
See application file for complete search history.

(56) References Cited

U.S. PATENT DOCUMENTS

2006/0180864 A1    8/2006  Suzuki et al.
2011/0175234 A1*  7/2011  Tomoda ................ H01L 23/585
                                                          257/774

* cited by examiner

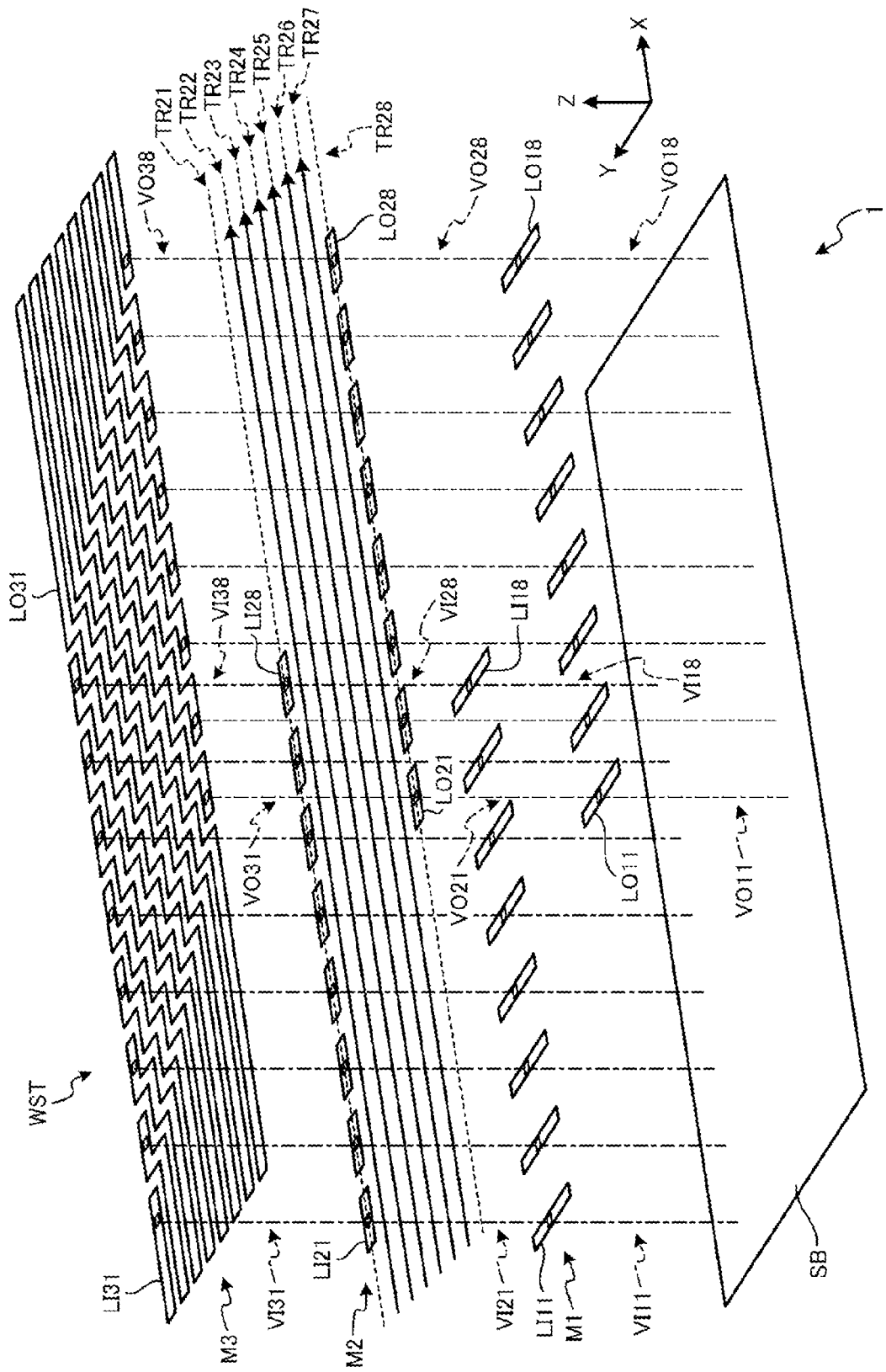

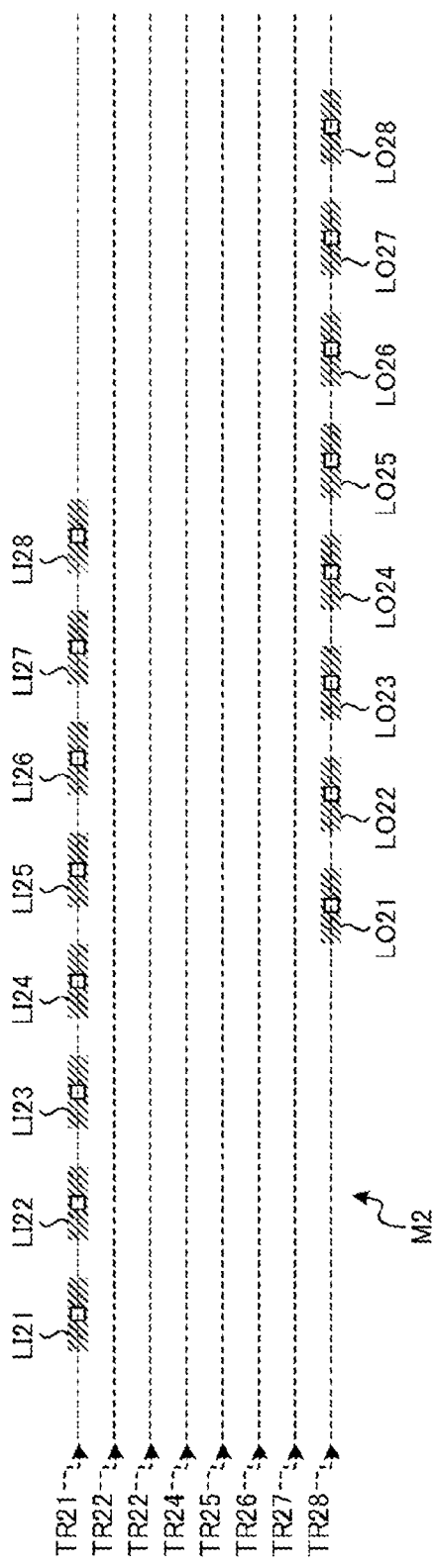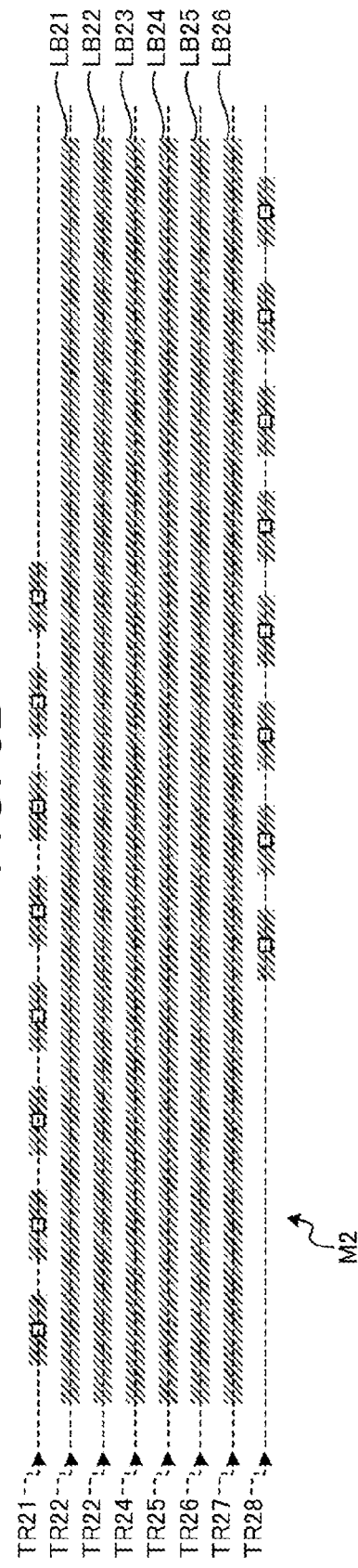

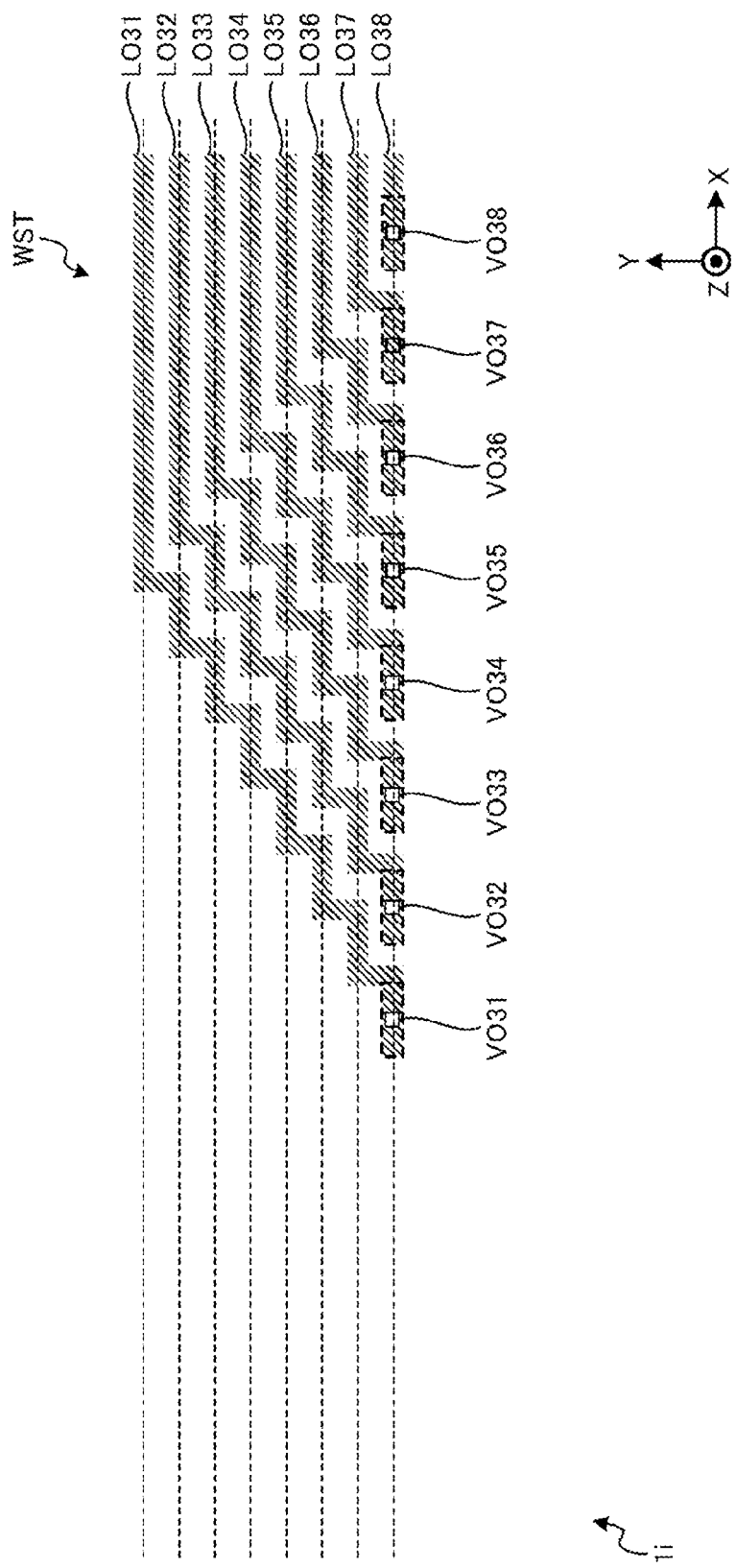

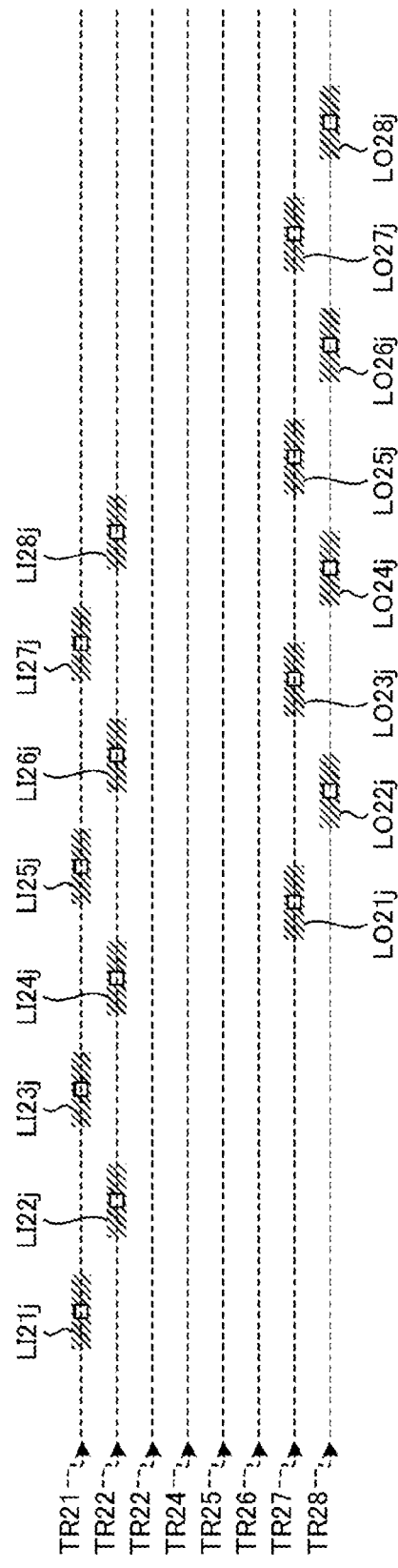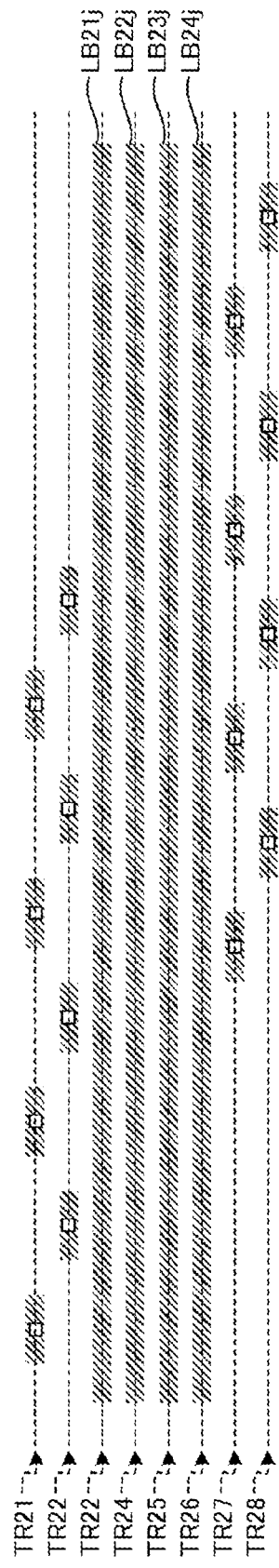

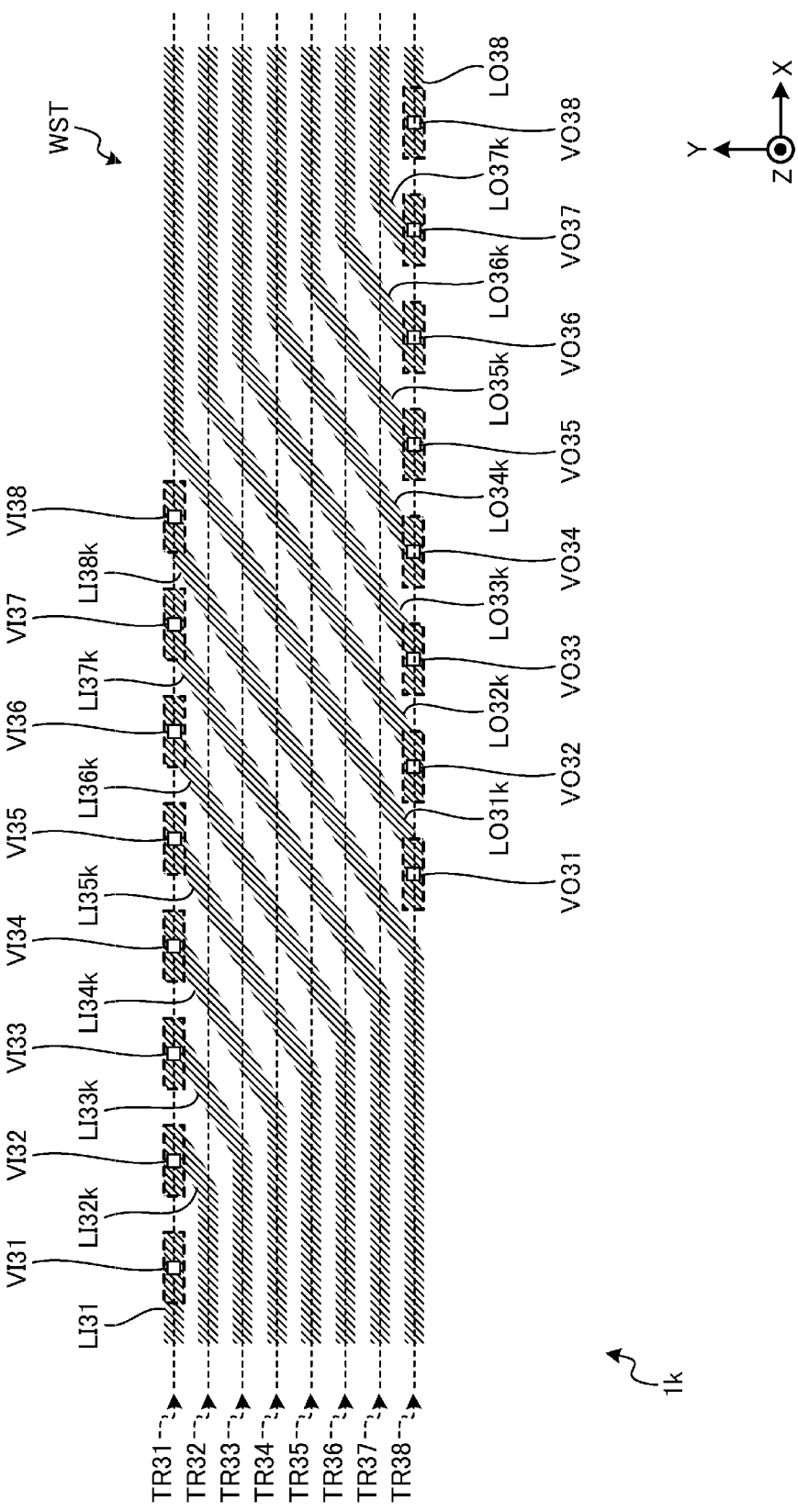

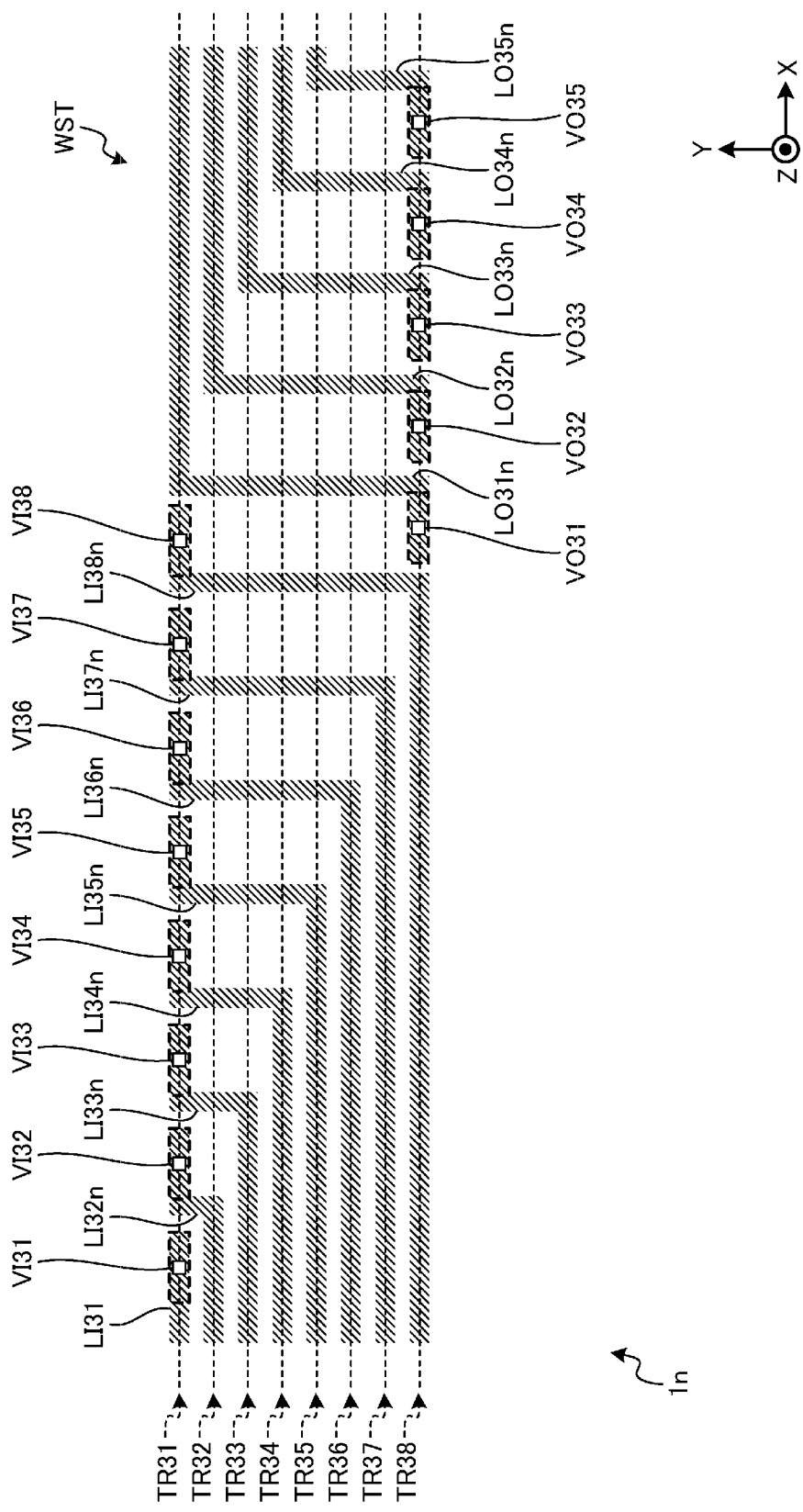

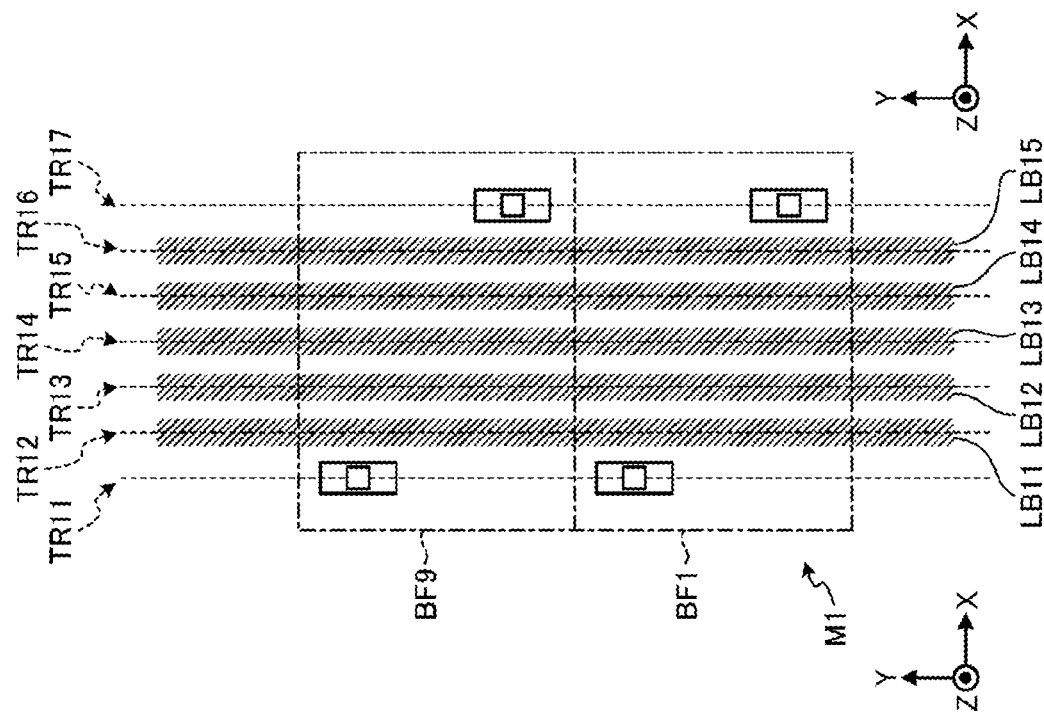
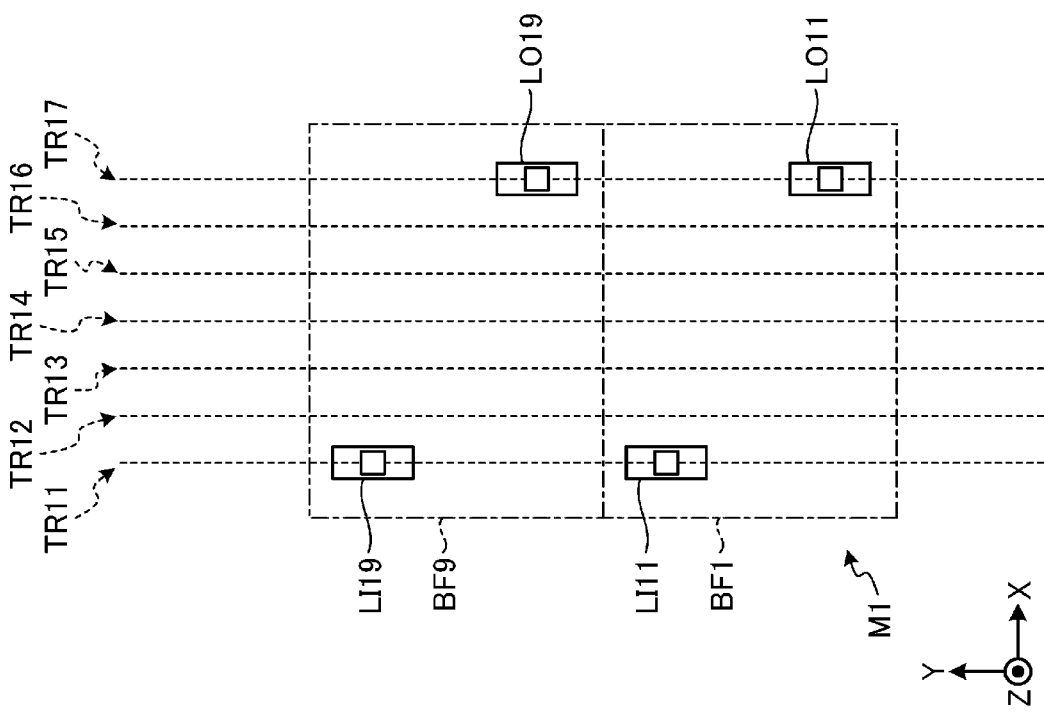

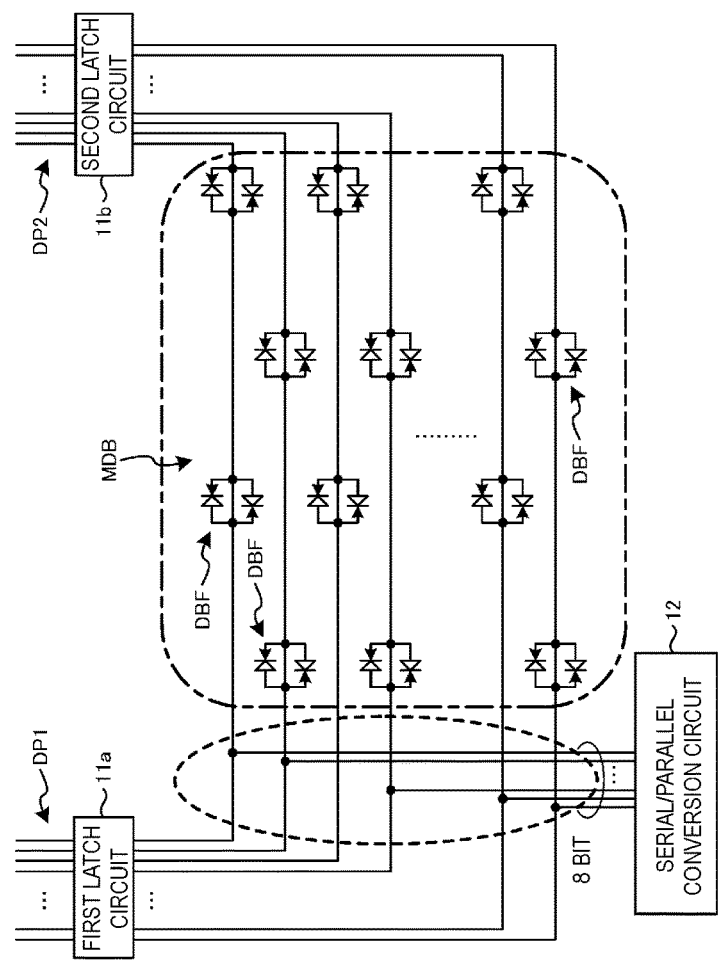
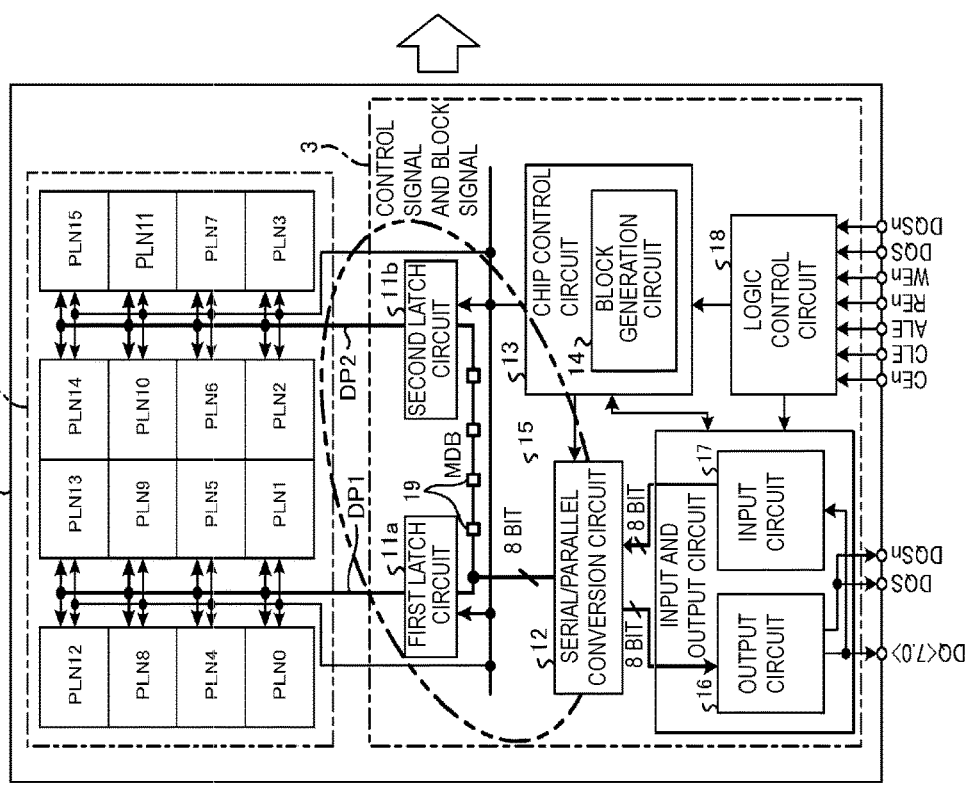
FIG. 14A
FIG. 14B

SEMICONDUCTOR DEVICE AND WIRING STRUCTURE

CROSS-REFERENCE TO RELATED APPLICATION(S)

This application is a continuation of U.S. patent application Ser. No. 17/183,813, filed Feb. 24, 2021, which is based upon and claims the benefit of priority from Japanese Patent Application No. 2020-153060, filed Sep. 11, 2020, the entire contents of which are incorporated herein by reference.

FIELD

Embodiments described herein relate generally to a semiconductor device and a wiring structure.

BACKGROUND

In a semiconductor device having a multilayer wiring structure, a wiring such as a line or a via plug is laid out for each wiring layer or between wiring layers. It would be desirable for such wiring to be efficiently laid out in each wiring layer.

DESCRIPTION OF THE DRAWINGS

FIG. 2 is a perspective view showing a configuration of the wiring structure of the semiconductor device according to the embodiment.

FIGS. 3A and 3B are plan views illustrating efficiency of layout design when a line is laid out in a wiring structure according to the embodiment.

FIG. 4 is a plan view showing a configuration of a wiring structure of the semiconductor device according to a first modification of the embodiment.

FIGS. 6A and 6B are plan views illustrating efficiency of layout design when a line is laid out in a wiring structure according to the second modification of the embodiment.

FIG. 7 is a plan view showing a configuration of a wiring structure of the semiconductor device according to a third modification of the embodiment.

FIG. 8 is a plan view showing a configuration of a wiring structure of the semiconductor device according to a fourth modification of the embodiment.

FIGS. 12A and 12B are plan views illustrating efficiency of layout design when a line is laid out in a wiring layer according to the fifth modification of the embodiment.

FIGS. 14A and 14B are diagrams showing a configuration of the semiconductor device of the embodiment.

DETAILED DESCRIPTION

Figure 1:
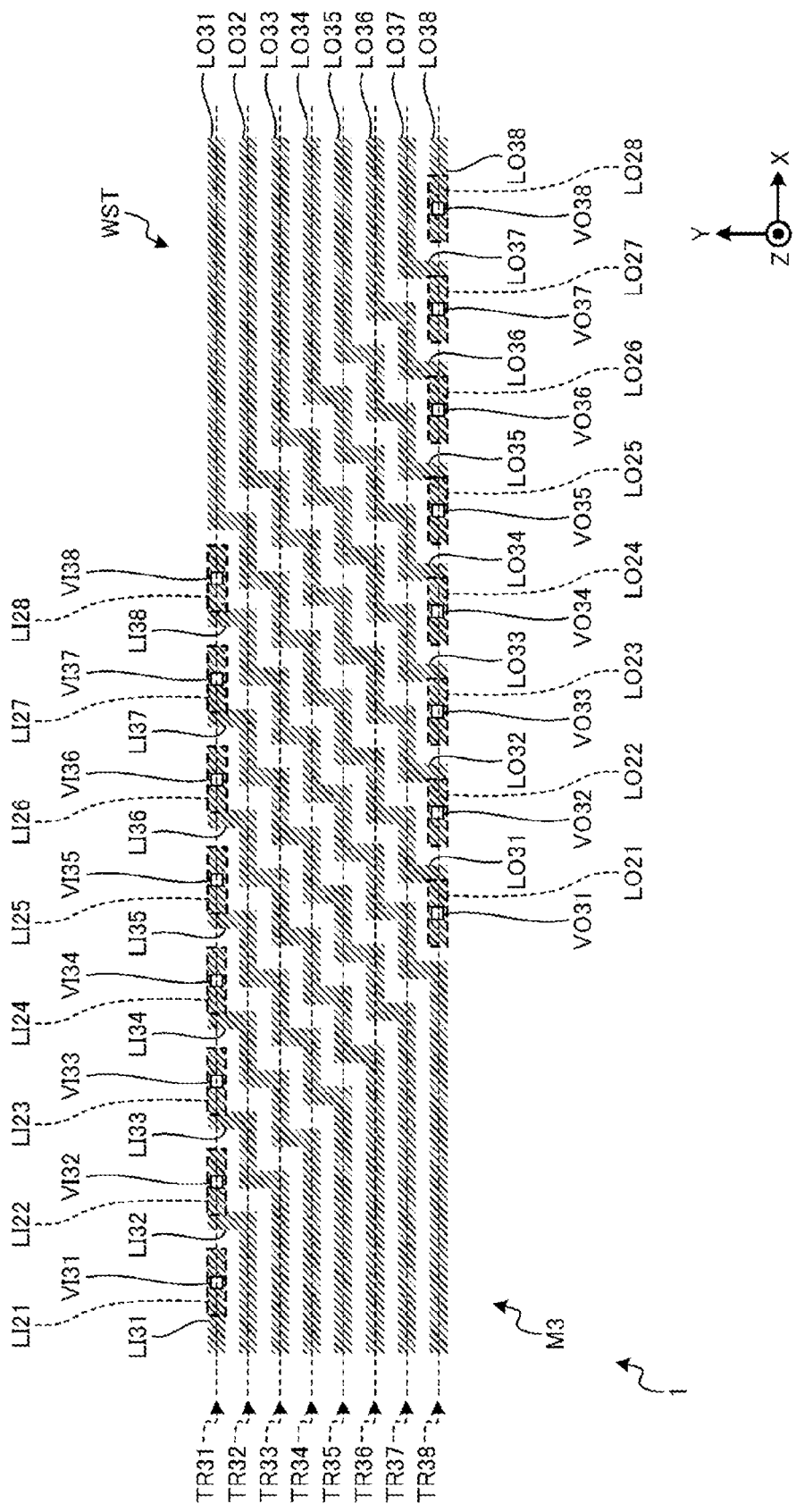
FIG. 1 is a plan view showing a configuration of a wiring structure of a semiconductor device according to an embodiment.

Embodiments provide a semiconductor device and a wiring structure that wiring in each wiring layer to be efficiently laid out.

In general, according to one embodiment, a semiconductor device includes a first wiring layer, a second wiring layer between the first wiring layer and a semiconductor substrate, and first and second via plugs. The first wiring layer has a plurality of parallel tracks along which a plurality of wirings are laid out, the tracks including first and second outer tracks and at least a first inner track between the first and second outer tracks, the plurality of wirings including a first line laid out along the first outer track and having an end portion that is laid out along the first outer track, and a second line laid out along the first inner track and having an end portion that is laid out along the first outer track. The first via plug is in contact with the end portion of the first line and extends between the first wiring layer and the second wiring layer, and the second via plug is in contact with the end portion of the second line and extends between the first wiring layer and the second wiring layer.

Hereinafter, a semiconductor device according to an embodiment will be described in detail with reference to attached drawings. The present disclosure is not limited to the embodiment.

Embodiment

A semiconductor device according to the embodiment is designed using an electronic design automation (EDA) tool. For example, a schematic diagram (e.g., schematic circuit diagram) is designed using a schematic editor to generate schematic data. A layout diagram corresponding to the schematic data is designed using a layout editor to generate layout data. Whether the design of the layout diagram matches the design of the schematic diagram is verified, or whether a physical design criterion (e.g., design rule) is satisfied is verified (e.g., by a design rule check), by a verification tool. When it is verified that the design rule is satisfied, mask data corresponding to the layout data is generated, a pattern corresponding to the mask data is drawn on the mask, and a semiconductor substrate is exposed and developed using the mask, thereby manufacturing a semiconductor device having a device pattern corresponding to the layout data on the semiconductor substrate.

In a layout design of a semiconductor device having a multilayer wiring structure, a wiring such as a line or a via plug is laid out for each wiring layer or between wiring layers. A plurality of wiring tracks arranged side by side may be provided in each wiring layer. The wiring track is a virtual line defined as a candidate place where the wiring is to be laid out in accordance with a priority wiring direction in the wiring layer, where the priority wiring direction is a predetermined direction at the time of the layout design.

For example, when first to third layers are prepared in order from a layer closest to a substrate as the wiring layers, it is conceivable that the second layer and the third layer are used as trunk lines, and the first layer is used as a branch line for connecting the trunk lines and a memory cell. A plurality of wiring tracks arranged side by side are provided in each of the second layer and the third layer. The plurality of wiring tracks in the second layer and the third layer may be arranged in parallel to one another. In the third layer, for a layout of input lines and output lines of a plurality of buffers, the same wiring tracks may be assigned to lines in the same buffer, and a plurality of different wiring tracks may be assigned among the plurality of buffers. In this case, the connection between the input lines and the output lines and the buffers may be a stack via in which via plugs are stacked in a direction perpendicular to a substrate surface across the plurality of wiring layers. The stack via is provided for different wiring tracks for each buffer in each wiring layer. Accordingly, the plurality of via plugs between the third layer and the second layer occupy a plurality of wiring tracks of the third layer at an upper end and a plurality of wiring tracks of the second layer at a lower end. Therefore, it may be difficult to pass the wirings (for example, lines) of the second layer in a linear manner below the trunk line of the third layer in parallel.

For example, when the lines are laid out and stitched between the via plugs in the second layer, a case in which the lines cannot be pulled out may occur depending on conditions, so that an overflow line needs to be provisioned in another wiring track as a bypass wiring. For this reason, a layout area is increased accordingly. When the lines are laid out and stitched between the via plugs, it is necessary to bend the lines while taking into consideration the design rule between the wirings. When a position of the via plug is changed in order to satisfy the design rule, man-hours for the layout design may be greatly increased if there is a return that also changes the bending points of the lines. Furthermore, if the layout is designed so as to stitch between the via plugs or the bypass wiring is laid out, a wiring length becomes long, and thus signal delay due to the wiring may be increased. Accordingly, it is difficult to efficiently lay out the wiring in the second layer. That is, in the second layer, it is difficult to efficiently provision the wiring track.

Therefore, in the semiconductor device according to the present embodiment, the plurality of lines extend along the plurality of wiring tracks arranged side by side in the wiring layer, and positions of the via plugs to a lower layer are aggregated on a wiring track on one of the two outer sides. Accordingly, the semiconductor device suitable for efficient provision of the wiring tracks in the lower layer can be provided.

Specifically, a semiconductor device 1 has a wiring structure WST as shown in FIGS. 1 and 2. FIG. 1 is a plan view showing a configuration of the wiring structure WST in the semiconductor device 1. FIG. 2 is a perspective view showing the configuration of the wiring structure WST in the semiconductor device 1. Hereinafter, a direction perpendicular to a surface of a substrate SB is a Z direction, and two directions orthogonal to each other in a plane perpendicular to the Z direction are an X direction and a Y direction.

The semiconductor device 1 has the multilayer wiring structure WST on a +Z side of the substrate SB. As shown in FIG. 2, a plurality of wiring layers M1 to M3 are disposed on the +Z side of the substrate SB. In FIG. 1, a layout configuration of the wiring layer M3 is shown. The plurality of wiring layers M1 to M3 shown in FIG. 2 are stacked in the Z direction of the substrate SB while being separated from one another in the Z direction. In practice, an interlayer insulating film (see FIG. 13) is provided between the substrate SB and the wiring layers M1 to M3. However, in FIG. 2, illustration of the interlayer insulating film is omitted for simplification. The wiring layer M2 is provided between the wiring layer M3 and the substrate SB in the Z direction. The wiring layer M1 is provided between the wiring layer M2 and the substrate SB in the Z direction. Although FIGS. 1 and 2 illustrate a case in which the number of stacked wiring layers is three, the number of stacked wiring layers may be two or four or more.

The wiring layer M3 shown in FIG. 1 is an uppermost wiring layer among the plurality of wiring layers M1 to M3. The wiring layer M3 includes three or more lines LI31 to LI38 arranged side by side and three or more lines LO31 to LO38 arranged side by side. The plurality of lines LI31 to LI38 correspond respectively to a plurality of buffers BF1 to BF8. Each line LI31 to LI38 can function as an input line for the corresponding buffer BF. The plurality of lines LO31 to LO38 correspond respectively to the plurality of buffers BF1 to BF8. Each line LO31 to LO38 can function as an output line for the corresponding buffer BF. That is, the plurality of lines LI31 to LI38 and the plurality of lines LO31 to LO38 correspond to each other. The line LI31 and the line LO31 form a pair as lines of the buffer BF1. The line LI32 and the line LO32 form a pair as lines of the buffer BF2. The lines LI33 to LI38 and the lines LO33 to LO38, respectively, form a pair as lines of the buffers BF3 to BF8.

The three or more lines LI31 to LI38 arranged side by side correspond to three or more wiring tracks TR31 to TR38 in the wiring layer M3. The three or more lines LO31 to LO38 arranged side by side correspond to the three or more wiring tracks TR31 to TR38 in the wiring layer M3.

The wiring tracks TR31 to TR38 are virtual lines defined as candidate places where the wiring is to be laid out in accordance with a priority wiring direction in the wiring layer M3, where the priority wiring direction is the X direction at the time of the layout design. The three or more wiring tracks TR31 to TR38 are arranged side by side (for example, in parallel) in the wiring layer M3. Each of the wiring tracks TR31 to TR38 extends in the X direction. In the wiring tracks TR31 to TR38 arranged side by side, the wiring tracks TR31 and TR38 are outer wiring tracks, and the wiring tracks TR32 to TR37 are inner wiring tracks.

In the wiring tracks TR31 to TR38 arranged side by side, via plugs VI31 to VI38 extending from the wiring layer M3 to the wiring layer M2 along the Z direction are disposed below the outer wiring track TR31. Main portions of the lines LI31 to LI38 extend along the corresponding wiring tracks TR31 to TR38. Connection portions of the lines LI32 to LI38 extend in a stepwise manner in a plan view while crossing the plurality of wiring tracks TR31 to TR38, and via plug positions are aggregated along the wiring track TR31.

In the wiring tracks TR31 to TR38 arranged side by side, via plugs VO31 to VO38 extending from the wiring layer M3 to the wiring layer M2 along the Z direction are disposed below the outer wiring track TR38. Main portions of the lines LO31 to LO38 extend along the corresponding wiring tracks TR31 to TR38. Connection portions of the lines LO31 to LO37 extend in a stepwise manner in a plan view while crossing the plurality of wiring tracks TR31 to TR38, and via plug positions are aggregated along the wiring track TR38.

In an XY plane view, stepwise patterns of the lines LI31 to LI38 are laid out so as to mesh with one another. Stepwise patterns of the lines LO31 to LO38 are laid out so as to mesh with one another. The stepwise pattern of the line LI38 and the stepwise pattern of the line LO31 are laid out so as to mesh with each other. Accordingly, the lines LI31 to LI38 and the lines LO31 to LO38 can reduce the entire size of the layout area.

For example, the line LI31 extends in a +X direction along the wiring track TR31, and is electrically connected to the via plug VI31 provided below the wiring track TR31. The line LI32 extends in the +X direction along the wiring track TR32, extends from the wiring track TR32 to the wiring track TR31 in the stepwise manner in the +X direction and a +Y direction, and is electrically connected to the via plug VI32 provided below the wiring track TR31. The line LI33 extends in the +X direction along the wiring track TR33, extends from the wiring track TR33 to the wiring track TR31 in the stepwise manner in the +X direction and the +Y direction, and is electrically connected to the via plug VI33 provided below the wiring track TR31. The line LI34 extends in the +X direction along the wiring track TR34, extends from the wiring track TR34 to the wiring track TR31 in the stepwise manner in the +X direction and the +Y direction, and is electrically connected to the via plug VI34 provided below the wiring track TR31. The line LI35 extends in the +X direction along the wiring track TR35, extends from the wiring track TR35 to the wiring track TR31 in the stepwise manner in the +X direction and the +Y direction, and is electrically connected to the via plug VI35 provided below the wiring track TR31. The line LI36 extends in the +X direction along the wiring track TR36, extends from the wiring track TR36 to the wiring track TR31 in the stepwise manner in the +X direction and the +Y direction, and is electrically connected to the via plug VI36 provided below the wiring track TR31. The line LI37 extends in the +X direction along the wiring track TR37, extends from the wiring track TR37 to the wiring track TR31 in the stepwise manner in the +X direction and the +Y direction, and is electrically connected to the via plug VI37 provided below the wiring track TR31. The line LI38 extends in the +X direction along the wiring track TR38, extends from the wiring track TR38 to the wiring track TR31 in the stepwise manner in the +X direction and the +Y direction, and is electrically connected to the via plug VI38 provided below the wiring track TR31. The lines LI31 to LI38 each have an end portion in the vicinity of a corresponding one of the via plugs VI31 to VI38 and on the +X side.

The line LO31 extends along the wiring track TR31, extends from the wiring track TR31 to the wiring track TR38 in the stepwise manner in an −X direction and a −Y direction, and is electrically connected to the via plug VO31 provided below the wiring track TR38. The line LO32 extends along the wiring track TR32, extends from the wiring track TR32 to the wiring track TR38 in the stepwise manner in the −X direction and the −Y direction, and is electrically connected to the via plug VO32 provided below the wiring track TR38. The line LO33 extends along the wiring track TR33, extends from the wiring track TR33 to the wiring track TR38 in the stepwise manner in the −X direction and the −Y direction, and is electrically connected to the via plug V033 provided below the wiring track TR38. The line LO34 extends along the wiring track TR34, extends from the wiring track TR34 to the wiring track TR38 in the stepwise manner in the −X direction and the −Y direction, and is electrically connected to the via plug VO34 provided below the wiring track TR38. The line LO35 extends along the wiring track TR35, extends from the wiring track TR35 to the wiring track TR38 in the stepwise manner in the −X direction and the −Y direction, and is electrically connected to the via plug VO35 provided below the wiring track TR38. The line LO36 extends along the wiring track TR36, extends from the wiring track TR36 to the wiring track TR38 in the stepwise manner in the −X direction and the −Y direction, and is electrically connected to the via plug V036 provided below the wiring track TR38. The line LO37 extends along the wiring track TR37, extends from the wiring track TR37 to the wiring track TR38 in the stepwise manner in the −X direction and the −Y direction, and is electrically connected to the via plug VO37 provided below the wiring track TR38. The line LO38 extends along the wiring track TR38 and is electrically connected to the via plug VO38 provided below the wiring track TR38. The lines LO31 to LO38 each have an end portion in the vicinity of a corresponding one of the via plugs VO31 to VO38 and on the −X side.

Focusing on the via plugs, in the XY plan view shown in FIG. 1, the via plug VI31, the via plug VI32, the via plug VI33, the via plug VI34, the via plug VI35, the via plug VI36, the via plug VI37, and the via plug VI38 are arranged in order in the +X direction along the wiring track TR31.

In an XYZ perspective view shown in FIG. 2, the via plug VI31 to which the line LI31 is connected includes stack vias, and a plurality of via plugs are stacked in the Z direction. The via plug VI31 is electrically connected to electrodes of the buffer BF1 (not shown) in the substrate SB through a line LI21 and a via plug VI21 in the wiring layer M2, and a line LI11 and a via plug Viii in the wiring layer M1. The via plugs VI32 to VI38 to which the lines LI32 to LI38 are respectively connected each include stack vias, and a plurality of via plugs are stacked in the Z direction. The via plugs VI32 to VI38 are respectively electrically connected to electrodes of the buffers BF2 to BF8 (not shown) in the substrate SB through lines LI22 to LI28 and via plugs VI22 to VI28 in the wiring layer M2, and lines LI12 to LI18 and via plugs VI12 to VI18 in the wiring layer M1.

Similarly, in the XY plan view shown in FIG. 1, the via plug VO31, the via plug VO32, the via plug VO33, the via plug VO34, the via plug VO35, the via plug VO36, the via plug VO37, and the via plug VO38 are arranged in order in the +X direction along the wiring track TR38.

In an XYZ perspective view shown in FIG. 2, the via plug VO31 to which the line LO31 is connected includes stack vias, and a plurality of via plugs are stacked in the Z direction. The via plug VO31 is electrically connected to electrodes of the buffer BF1 (not shown) in the substrate SB through a line LO21 and a via plug VO21 in the wiring layer M2, and a line LO11 and a via plug VO11 in the wiring layer M1. The via plugs VO32 to VO38 to which the lines LO32 to LO38 are respectively connected each include stack vias, and a plurality of via plugs are stacked in the Z direction. The via plugs VO32 to VO38 are respectively electrically connected to electrodes of the buffers BF2 to BF8 (not shown) in the substrate SB through lines LO22 to LO28 and via plugs VO22 to VO28 in the wiring layer M2, and lines LO12 to LO18 and via plugs VO12 to VO18 in the wiring layer M1.

At this time, the wiring layer M2 includes wiring tracks TR21 to TR28 corresponding to the wiring tracks TR31 to TR38 of the wiring layer M3. The wiring layer M2 can reduce the number of wiring tracks occupied by the stack vias of the via plugs VI31 to VI38 and the stack vias of the via plugs VO31 to VO38 among the wiring tracks TR21 to TR28 to two (wiring tracks TR21, TR28). Accordingly, as shown by solid arrows in FIG. 2, six wiring tracks TR22 to TR27 can be provisioned as the wiring tracks that can be laid out optionally.

FIGS. 3A and 3B show a procedure for the layout design. FIGS. 3A and 3B are plan views illustrating the efficiency of the layout design when a line is laid out in a wiring layer.

In a step in FIG. 3A, in the wiring layer M2, the lines LI21 to LI28 for connecting the via plugs VI31 to VI38 and the via plugs VI21 to VI28 (see FIG. 2) are laid out on the wiring track TR21. XY positions of the lines LI21 to LI28 correspond to XY positions (see FIG. 1) of the end portions of the lines LI31 to LI38. In the wiring layer M2, the lines LO21 to LO28 for connecting the via plugs VO31 to VO38 and the via plugs VO21 to VO28 (see FIG. 2) are laid out on the wiring track TR28. XY positions of the lines LO21 to LO28 correspond to XY positions (see FIG. 1) of the end portions of the lines LO31 to LO38.

In a step in FIG. 3B, in the wiring layer M2, for example, when a bus wiring having a width of 6 bits is desired to be laid out, six lines LB21 to LB26 can be laid out on the six wiring tracks TR22 to TR27 respectively and extend in a linear manner. That is, compared to the case in which each line LB21 to LB26 is laid out and stitched between the via plugs, there is no loss of productivity in connection with preparing another track. As such, the layout can be generated with less man-hours, and work efficiency can be improved. Since the lines LB21 to LB26 are laid out in a straight line so that the wiring length can be shortened, total signal delay can be reduced.

As described above, in the semiconductor device 1 according to the present embodiment, the plurality of lines LI31 to LI38 extend along the plurality of wiring tracks TR31 to TR38 in the wiring layer M3, and the positions of the via plugs VI31 to VI38 to the lower layer are aggregated on the wiring track TR31 on one of the two outer sides. Similarly, the plurality of lines LO31 to LO38 extend along the wiring tracks TR31 to TR38 in the wiring layer M3, and the positions of the via plugs V031 to V038 to the lower layer are aggregated on the wiring track TR38 on one of the two outer sides. Accordingly, the semiconductor device 1 suitable for efficiently provisioning the wiring tracks of the wiring layer M2 below the wiring layer M3 can be provided.

In the present embodiment, since the wiring tracks of the wiring layer M2 below the wiring layer M3 can be efficiently provisioned, the layout area of the wiring layer M2 can be reduced. Accordingly, since a chip area can be reduced, cost of the semiconductor device 1 can be reduced. Since the layout design of the wiring of the wiring layer M2 can be efficiently performed, the cost of the semiconductor device 1 can be reduced. Further, the wiring layer M2 can prevent variation in length among a plurality of lines provided in the bus wiring and can prevent variation in an amount of signal delay among the plurality of lines, and wiring quality can be improved. Since the wiring lengths are aligned in the direction of shortening the wiring length for the plurality of lines, total signal delay can be reduced.

As shown in FIG. 4, the wiring structure WST in a semiconductor device 1i may have a configuration in which the plurality of lines LI31 to LI38 in the wiring layer M3 and the stack vias associated therewith are omitted. FIG. 4 is a plan view showing a configuration of the semiconductor device 1i according to a first modification of the embodiment. Even in this case, the plurality of lines LO31 to LO38 extend along the wiring tracks TR31 to TR38, and the positions of the via plugs VO31 to VO38 to the lower layer are aggregated on the wiring track TR38 on one of the two outer sides. Accordingly, the semiconductor device 1i suitable for efficiently provisioning the wiring tracks in the wiring layer M2 below the wiring layer M3 can be provided.

Figure 5:
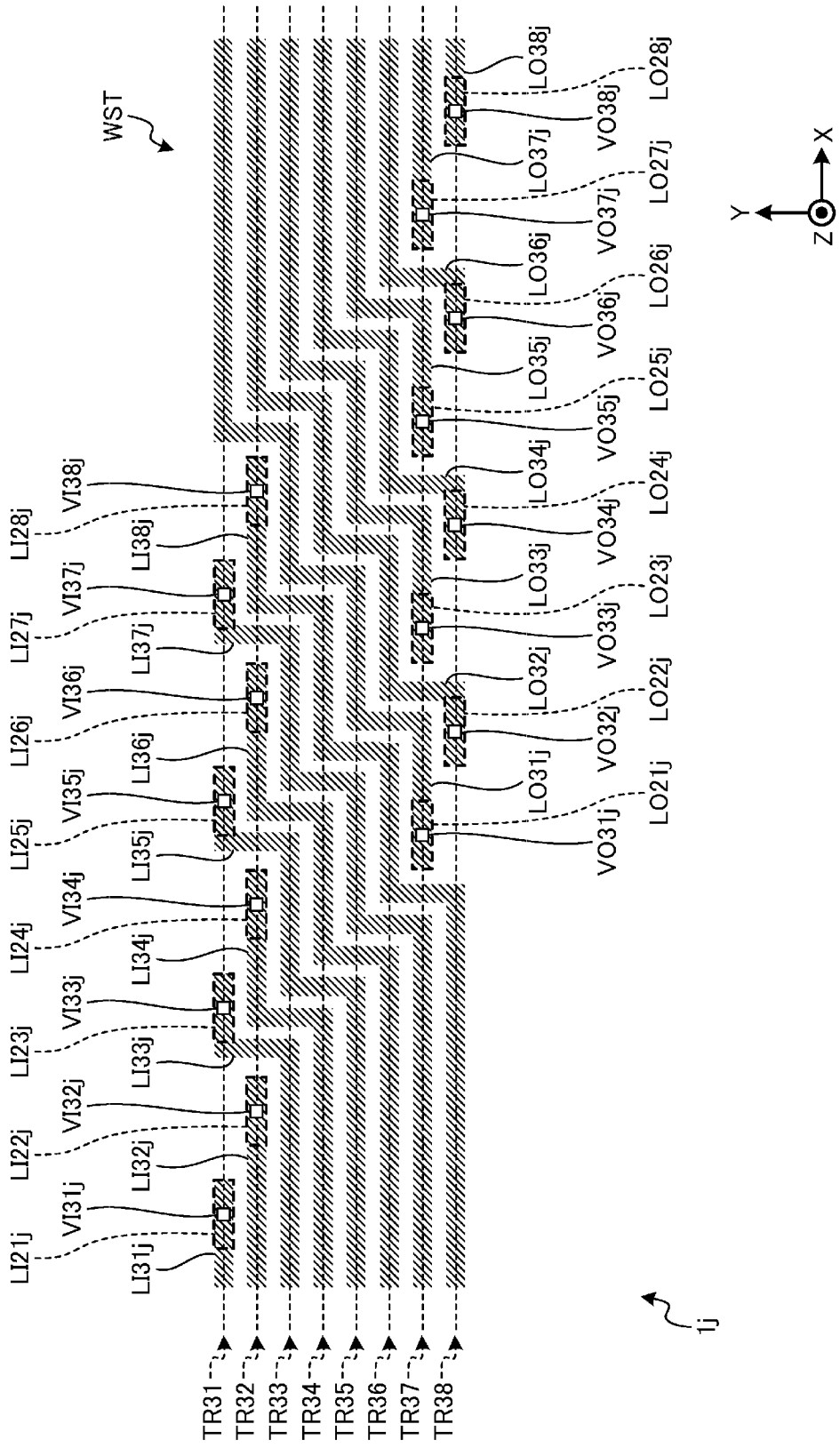
FIG. 5 is a plan view showing a configuration of a wiring structure of the semiconductor device according to a second modification of the embodiment.

Alternatively, as shown in FIG. 5, the wiring structure WST in a semiconductor device 1j may have a configuration in which the wiring layer M3 is laid out by bending a set of two or more when the wiring is bent in a stepwise manner. FIG. 5 is a plan view showing a configuration of the semiconductor device 1j according to a second modification of the embodiment. Even in this case, a plurality of lines LI31j to LI38j extend along the plurality of wiring tracks TR31 to TR38 in the wiring layer M3, and positions of via plugs VI31j to VI38j to the lower layer are aggregated on the two wiring tracks TR31, TR32 on one of the two outer sides.

The via plugs VI31j to VI38j are arranged in the +X direction while being alternately arranged on the two wiring tracks TR31, TR32. Similarly, a plurality of lines LO31j to LO38j extend along the wiring tracks TR31 to TR38, and positions of via plugs VO31j to VO38j to the lower layer are aggregated on the two wiring tracks TR37, TR38 on one of the two outer sides. The via plugs VO31j to VO38j are arranged in the +X direction while being alternately arranged on the two wiring tracks TR37, TR38. Accordingly, the semiconductor device 1j suitable for efficiently provisioning the wiring tracks in the wiring layer M2 below the wiring layer M3 can be provided.

For example, FIGS. 6A and 6B illustrate a procedure for the layout design. FIGS. 6A and 6B are plan views illustrating efficiency of the layout design when a line is laid out in a wiring layer.

In a step in FIG. 6A, in the wiring layer M2, lines LI21j to LI28j for connecting the via plugs VI31j to VI38j and the via plugs VI21j to VI28j (see FIG. 2) are laid out alternately on the wiring tracks TR21, TR22. XY positions of the lines LI21 to LI28 correspond to the XY positions at the end portions of the lines LI31j to LI38j (see FIG. 5). In the wiring layer M2, lines LO21j to LO28j for connecting the via plugs VO31j to VO38j and the via plugs VO21j to VO28j (see FIG. 2) are laid out alternately on the wiring tracks TR27, TR28. XY positions of the lines LO21j to LO28j correspond to the XY positions of the end portions of the lines LO31j to LO38j (see FIG. 5).

At this time, the number of wiring tracks occupied according to the stack vias of the via plug VI31j to the via plug VI38j and the stack vias of the via plug VO31j to the via plug VO38j can be reduced to four (wiring tracks TR21, TR22, TR27, TR28). Accordingly, four wiring tracks TR23 to TR26 can be provisioned as wiring tracks that can be laid out optionally.

In a step in FIG. 6B, in the wiring layer M2, for example, when a bus wiring having a width of 4 bits is desired to be laid out, four lines LB21j to LB24j can be laid out on the four wiring tracks TR23 to TR26 so as to extend in a linear manner. That is, compared to the case in which each line LB21j to LB24j is laid out and stitching between the via plugs, there is no loss of productivity in connection with preparing another track. As such, the layout can be generated with less man-hours, and work efficiency can be improved. Since the lines LB21j to LB24j are laid out in a straight line so that the wiring length can be shortened, total signal delay can be reduced.

Alternatively, as shown in FIG. 7, the wiring structure WST in a semiconductor device 1k may have a configuration in which a wiring shape in the wiring layer M3, which is stepwise, is replaced with an oblique linear wiring. FIG. 7 is a plan view showing a configuration of the semiconductor device 1k according to a third modification of the embodiment.

For example, a line LI32k extends from the wiring track TR32 to the wiring track TR31 obliquely and linearly in the +X direction and the +Y direction. A line LI33k extends from the wiring track TR33 to the wiring track TR31 obliquely and linearly in the +X direction and the +Y direction. A line LI34k extends from the wiring track TR34 to the wiring track TR31 obliquely and linearly in the +X direction and the +Y direction. A line LI35k extends from the wiring track TR35 to the wiring track TR31 obliquely and linearly in the +X direction and the +Y direction. A line LI36k extends from the wiring track TR36 to the wiring track TR31 obliquely and linearly in the +X direction and the +Y direction. A line LI37k extends from the wiring track TR37 to the wiring track TR31 obliquely and linearly in the +X direction and the +Y direction. A line LI38k extends from the wiring track TR38 to the wiring track TR31 obliquely and linearly in the +X direction and the +Y direction.

The line LO31 extends from the wiring track TR31 to the wiring track TR38 obliquely and linearly in the −X direction and the −Y direction. The line LO32 extends from the wiring track TR32 to the wiring track TR38 obliquely and linearly in the −X direction and the −Y direction. The line LO33 extends from the wiring track TR33 to the wiring track TR38 obliquely and linearly in the −X direction and the −Y direction. The line LO34 extends from the wiring track TR34 to the wiring track TR38 obliquely and linearly in the −X direction and the −Y direction. The line LO35 extends from the wiring track TR35 to the wiring track TR38 obliquely and linearly in the −X direction and the −Y direction. The line LO36 extends from the wiring track TR36 to the wiring track TR38 obliquely and linearly in the −X direction and the −Y direction. The line LO37 extends from the wiring track TR37 to the wiring track TR38 obliquely and linearly in the −X direction and the −Y direction.

Also in this configuration, the plurality of lines LI31, and LI32k to LI38k extend along the plurality of wiring tracks TR31, and TR32 to TR38 arranged side by side in the wiring layer M3, and the positions of the via plugs VI31, and VI32 to VI38 to the lower layer are aggregated on the wiring track TR31 on one of the two outer sides. Similarly, a plurality of lines LO31k to LO37k, and LO38 extend along the wiring tracks TR31 to TR37, and TR38, and the positions of the via plugs VO31 to VO37, and VO38 to the lower layer are aggregrated on the wiring track TR38 on one of the two outer sides. Accordingly, the semiconductor device 1k suitable for efficiently provisioning the wiring tracks in the wiring layer M2 below the wiring layer M3 can be provided.

Alternatively, as shown in FIG. 8, the wiring structure WST in a semiconductor device in may have a configuration in which a wiring shape in the wiring layer M3, which is stepwise, is replaced with a vertical linear wiring. FIG. 8 is a plan view showing a configuration of the semiconductor device in according to a fourth modification of the embodiment.

For example, a line LI32n extends from the wiring track TR32 to the wiring track TR31 in a linear manner in the +Y direction. A line LI33n extends from the wiring track TR33 to the wiring track TR31 in the linear manner in the +Y direction. A line LI34n extends from the wiring track TR34 to the wiring track TR31 in the linear manner in the +Y direction. A line LI35n extends from the wiring track TR35 to the wiring track TR31 in the linear manner in the +Y direction. A line LI36n extends from the wiring track TR36 to the wiring track TR31 in the linear manner in the +Y direction. A line LI37n extends from the wiring track TR37 to the wiring track TR31 in the linear manner in the +Y direction. A line LI38n extends from the wiring track TR38 to the wiring track TR31 in the linear manner in the +Y direction.

A line LO31n extends from the wiring track TR31 to the wiring track TR38 in the linear manner in the −Y direction. A line LO32n extends from the wiring track TR32 to the wiring track TR38 in the linear manner in the −Y direction. A line LO33n extends from the wiring track TR33 to the wiring track TR38 in the linear manner in the −Y direction. A line LO34n extends from the wiring track TR34 to the wiring track TR38 in the linear manner in the −Y direction. A line LO35n extends from the wiring track TR35 to the wiring track TR38 in the linear manner in the −Y direction. Although not shown, a line LO36n extends from the wiring track TR36 to the wiring track TR38 in the linear manner in the −Y direction. Although not shown, a line LO37n extends from the wiring track TR37 to the wiring track TR38 in the linear manner in the −Y direction.

Also in this configuration, the plurality of lines LI31, and LI32n to LI38n extend along the plurality of wiring tracks TR31, and TR32 to TR38 arranged side by side in the wiring layer M3, and the positions of the via plugs VI31, and VI32 to VI38 to the lower layer are aggregated on the wiring track TR31 on one of the two outer sides. Similarly, the plurality of lines LO31n to LO37n, and LO38 extend along the wiring tracks TR31 to TR37, and TR38, and the positions of the via plugs VO31 to VO37, and VO38 to the lower layer are aggregated on the wiring track TR38 on one of the two outer sides. Accordingly, the semiconductor device 1k suitable for efficiently provisioning the wiring tracks in the wiring layer M2 below the wiring layer M3 can be provided.

Figure 9A:
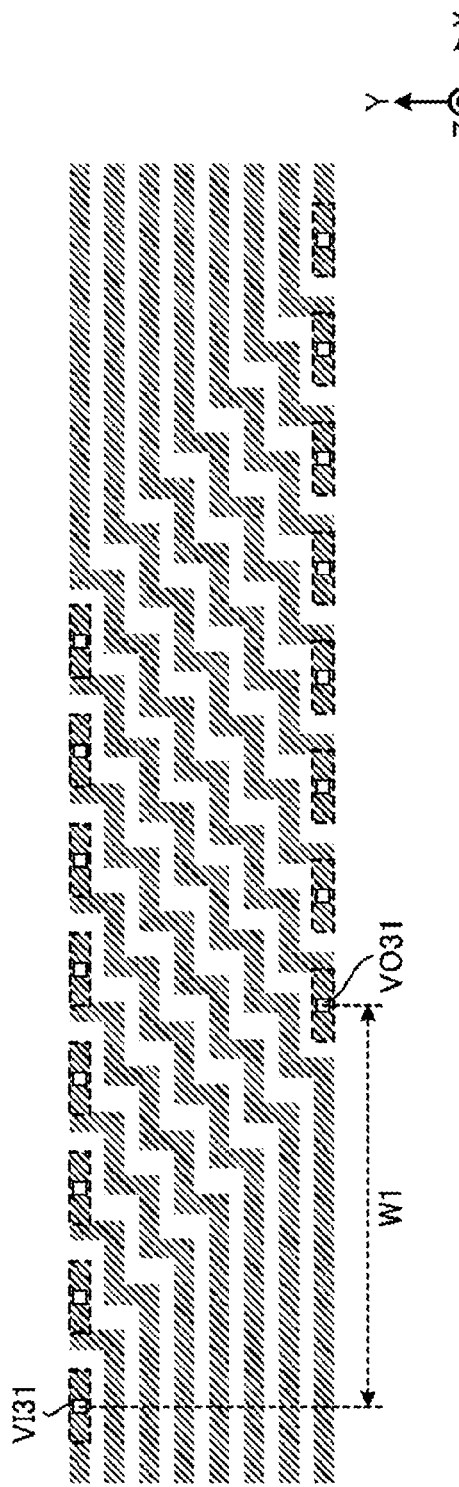
FIGS. 9A and 9B are plan views showing a plane distance between paired via plugs in the embodiment and the fourth modification of the embodiment.
Figure 9B:
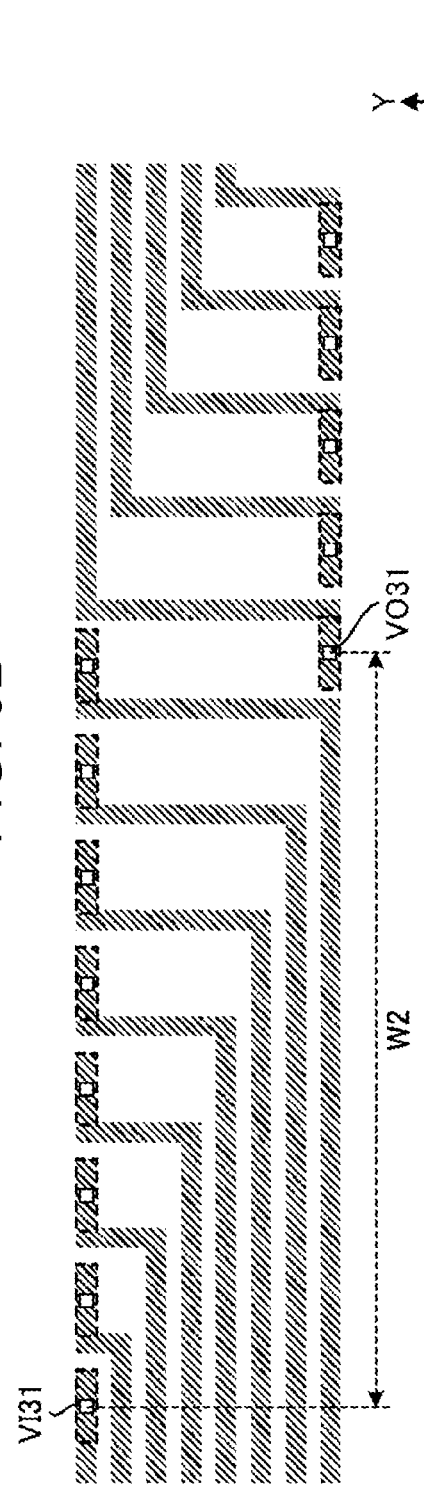

Regarding the layout configuration of the wiring layer M3, a comparison between the configuration according to the embodiment and the configuration according to the fourth modification of the embodiment is shown in FIGS. 9A and 9B. FIGS. 9A and 9B are plan views showing a plane distance between paired via plugs according to the embodiment and the fourth modification of the embodiment. FIG. 9A shows the configuration according to the embodiment, and FIG. 9B shows the configuration according to the fourth modification of the embodiment. In the embodiment, as shown in FIG. 9A, a portion of a plurality of lines that crosses the wiring tracks is a stepwise layout configuration. In the fourth modification of the embodiment, as shown in FIG. 9B, a portion of a plurality of lines that crosses the wiring tracks is a vertical linear layout configuration. A distance W1 in the X direction between the paired via plugs VI31, V031 in the stepwise layout configuration shown in FIG. 9A is smaller than a distance W2 in the X direction between the paired via plugs VI31, V031 in the vertical linear layout configuration shown in FIG. 9B. To efficiently connect the paired via plugs from the wiring layer M3 to an input node and an output node of the buffer on the substrate SB in the stack via configuration, the distance in the X direction between the paired via plugs should be small. From this viewpoint, as an efficient layout configuration of the input and output lines to the buffer, a stepwise configuration is considered to be more suitable.

Figure 10:
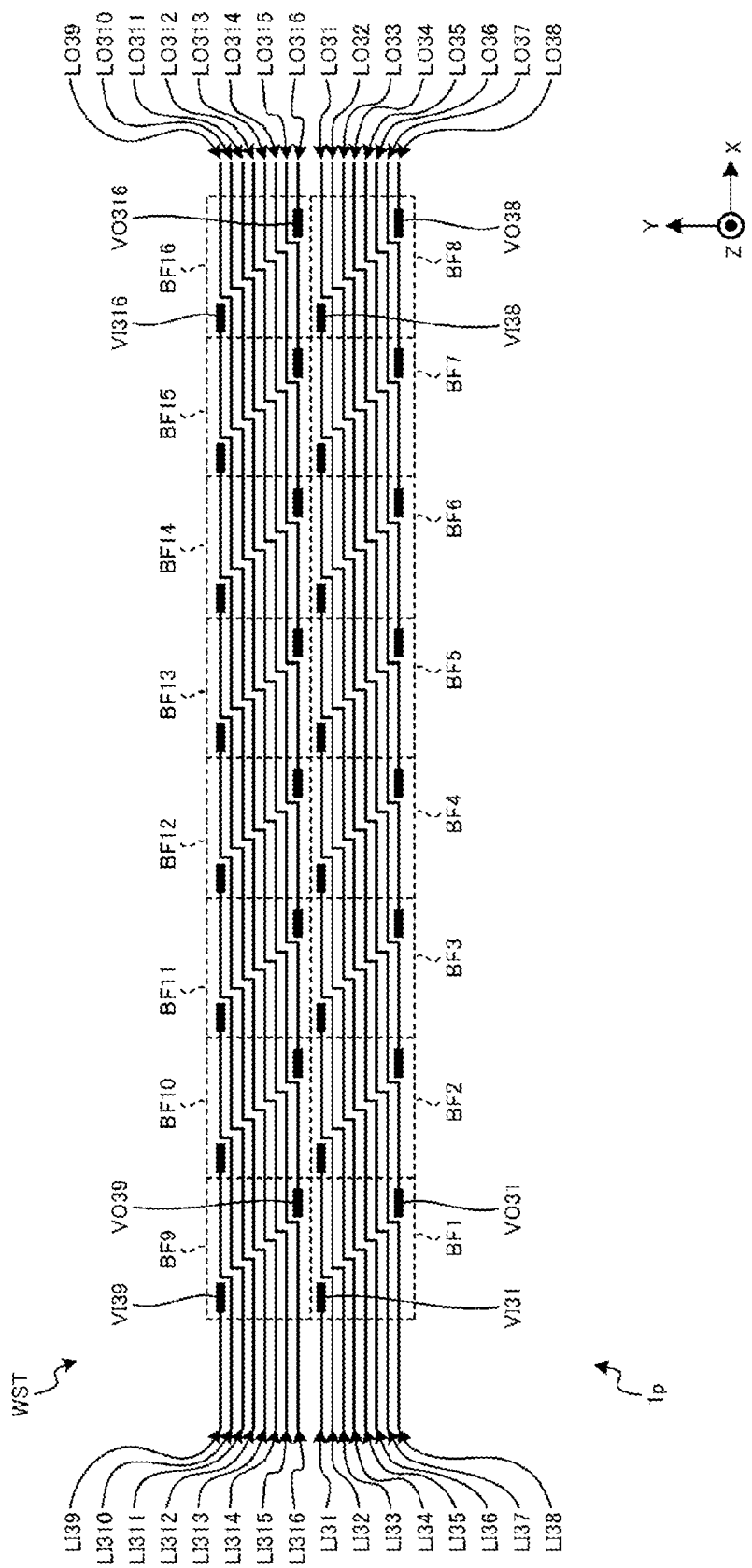
FIG. 10 is a plan view showing a configuration of a wiring structure of the semiconductor device according to a fifth modification of the embodiment.
Figure 11:
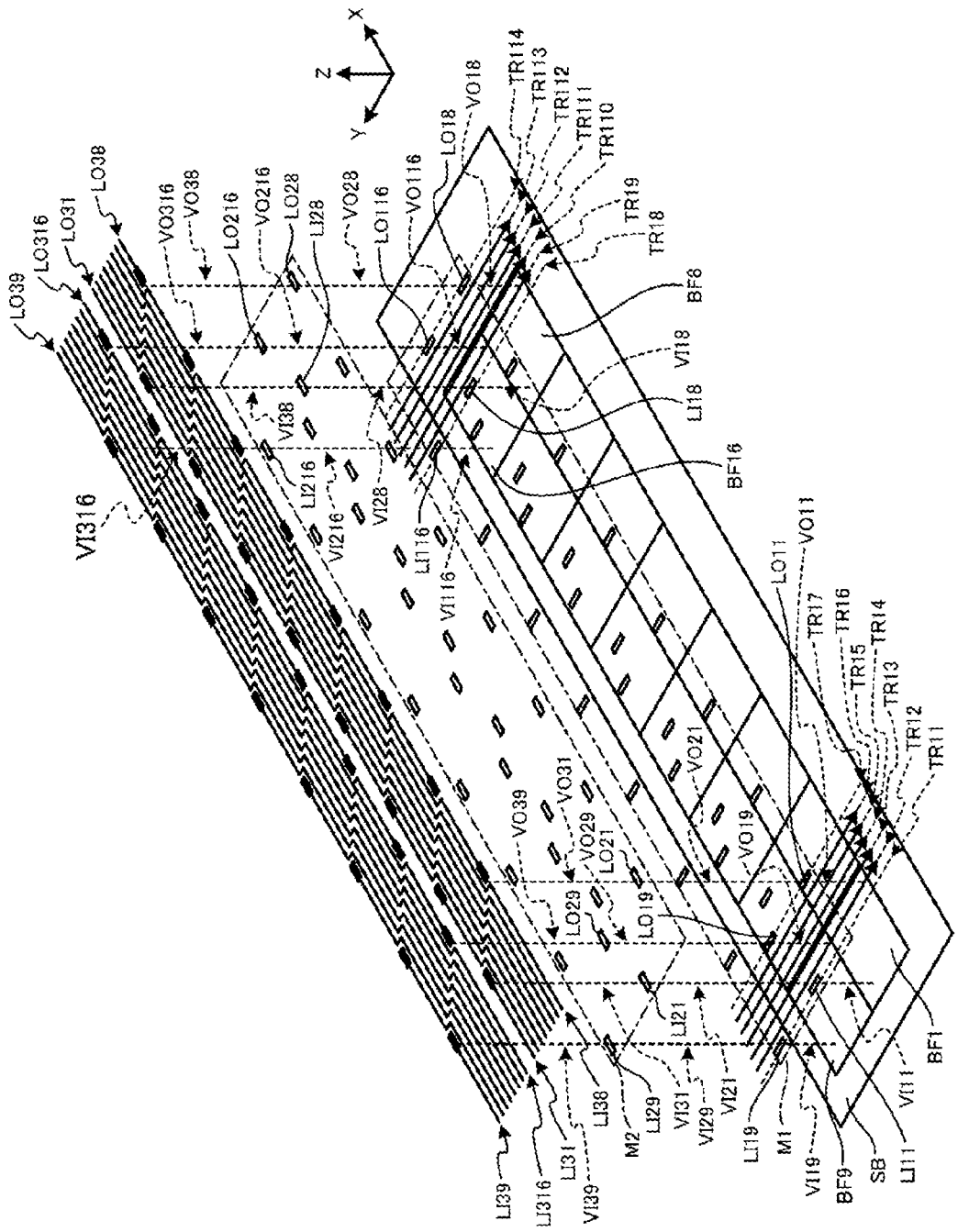
FIG. 11 is a perspective view showing the configuration wiring structure of the of the semiconductor device according to the fifth modification of the embodiment.

Based on such consideration, as shown in FIGS. 10 and 11, the wiring structure WST in a semiconductor device 1p may be customized such that the stepwise layout configuration of the wiring layer M3 fits the plane dimensions of the buffers. FIG. 10 is a plan view showing a configuration of the semiconductor device 1p according to a fifth modification of the embodiment. FIG. 11 is a perspective view showing the configuration of the semiconductor device 1p according to the fifth modification of the embodiment.

In FIG. 11, as a multilayer wiring structure WST, a structure in which the wiring layers M1 to M3 are stacked in order on the +Z side of the substrate SB is shown. Among the wiring layers M1 to M3, FIG. 10 shows the layout configuration of the wiring layer M3.

For example, main portions of both the input line LI31 to the buffer BF1 and the output line LO31 from the buffer BF1 extend along the same wiring track (eighth wiring track from the −Y side), and the output line LO31 extends in a stepwise manner to the wiring track (first wiring track from the −Y side) at the position of the via plug VO31. Further, a distance between the via plug VI31 connected to the input line LI31 and the via plug VO31 connected to the output line LO31 in the X direction is within the size of the buffer BF1 in the X direction, and a distance between the via plug VI31 and the via plug VO31 in the Y direction is within the size of the buffer BF1 in the Y direction.

Main portions of both the input line LI38 to a buffer BF8 and the output line LO38 from the buffer BF8 extend along the same wiring track (first wiring track from the −Y side), and the input line LI38 extends in the stepwise manner to the wiring track (eighth wiring track from the −Y side) at the position of the via plug VI38. Further, a distance between the via plug VI38 connected to the input line LI38 and the via plug VO38 connected to the output line LO38 in the X direction is within the size of the buffer BF8 in the X direction, and a distance between the via plug VI38 and the via plug VO38 in the Y direction is within the size of the buffer BF8 in the Y direction.

Main portions of both an input line LI39 to a buffer BF9 and an output line LO39 from the buffer BF9 extend along the same wiring track (first wiring track from the +Y side), and the output line LO39 extends stepwise to the wiring track (eighth wiring track from the +Y side) at a position of a via plug VO39. Further, a distance between the via plug VI39 connected to the input line LI39 and the via plug VO39 connected to the output line LO39 in the X direction is within the size of the buffer BF9 in the X direction, and a distance between the via plug VI39 and the via plug VO39 in the Y direction is within the size of the buffer BF9 in the Y direction.

Main portions of both an input line LI316 to a buffer BF16 and an output line LO316 from the buffer BF16 extend along the same wiring track (eighth wiring track from the +Y side), and the input line LI316 extends in the stepwise manner to the wiring track (first wiring track from the +Y side) at a position of a via plug VO316. Further, a distance between the via plug VI316 connected to the input line LI316 and the via plug VO316 connected to the output line LO316 in the X direction is within the size of the buffer BF16 in the X direction, and a distance between the via plug VI316 and the via plug VO316 in the Y direction is within the size of the buffer BF16 in the Y direction.

In an XYZ perspective view shown in FIG. 11, the via plug VI31 to which the line LI31 is connected includes stack vias, and a plurality of via plugs are stacked in the Z direction. The via plug VI31 is electrically connected to the electrodes of the buffer BF1 (not shown) in the substrate SB through the line LI21 and the via plug VI21 in the wiring layer M2, and the line LI11 and the via plug VI11 in the wiring layer M1. The via plug VO31 to which the line LO31 is connected includes stack vias, and a plurality of via plugs are stacked in the Z direction. The via plug VO31 is electrically connected to the electrodes of the buffer BF1 in the substrate SB through the line LO21 and the via plug VO21 in the wiring layer M2, and the line LO11 and the via plug VO11 in the wiring layer M1. The via plug VI39 to which the line LI39 is connected includes stack vias, and a plurality of via plugs are stacked in the Z direction. The via plug VI39 is electrically connected to electrodes of the buffer BF9 in the substrate SB through a line LI29 and a via plug VI29 in the wiring layer M2, and a line LI19 and a via plug VI19 in the wiring layer M1. The via plug VO39 to which the line LO39 is connected includes stack vias, and a plurality of via plugs are stacked in the Z direction. The via plug VO39 is electrically connected to the electrodes of the buffer BF9 in the substrate SB through a line LO29 and a via plug VO29 in the wiring layer M2, and a line LO19 and a via plug VO19 in the wiring layer M1.

At this time, the wiring layer M1 includes the wiring tracks TR11 to TR17 which are on the +Z side of the buffers BF1 and BF9 and the priority wiring direction is the Y direction. The wiring layer M1 can reduce the number of wiring tracks occupied by the stack vias of the via plug VI31 and the via plug VI39 and the stack vias of the via plug VO31 and the via plug VO39 among the wiring tracks TR11 to TR17 to two (wiring tracks TR11, TR17). Accordingly, as shown by solid arrows in FIG. 11, five wiring tracks TR12 to TR16 can be provisioned as the wiring tracks that can be laid out optionally.

Similarly, the via plug VI38 to which the line LI38 is connected includes stack vias, and a plurality of via plugs are stacked in the Z direction. The via plug VI38 is electrically connected to electrodes of the buffer BF8 (not shown) in the substrate SB through the line LI28 and the via plug VI28 in the wiring layer M2, and the line LI18 and the via plug VI18 in the wiring layer M1. The via plug VO38 to which the line LO38 is connected includes stack vias, and a plurality of via plugs are stacked in the Z direction. The via plug VO38 is electrically connected to the electrodes of the buffer BF8 in the substrate SB through the line LO28 and the via plug VO28 in the wiring layer M2, and the line LO18 and the via plug VO18 in the wiring layer M1. The via plug VI316 to which the line LI316 is connected includes stack vias, and a plurality of via plugs are stacked in the Z direction. The via plug VI316 is electrically connected to electrodes of the buffer BF16 in the substrate SB through a line LI216 and a via plug VI216 in the wiring layer M2, and a line LI116 and a via plug VI116 in the wiring layer M1. The via plug VO316 to which the line LO316 is connected includes stack vias, and a plurality of via plugs are stacked in the Z direction. The via plug VO316 is electrically connected to the electrodes of the buffer BF16 in the substrate SB through a line LO216 and a via plug VO216 in the wiring layer M2, and a line LO116 and a via plug VO116 in the wiring layer M1.

At this time, the wiring layer M1 includes wiring tracks TR18 to TR114 which are on the +Z side of the buffers BF8 and BF16 and the priority wiring direction is the Y direction. The wiring layer M1 can reduce the number of wiring tracks occupied by the stack vias of the via plug VI38 and the via plug VI316 and the stack vias of the via plug VO38 and the via plug VO316 among the wiring tracks TR18 to TR114 to two (wiring tracks TR18, TR114). Accordingly, as shown by solid arrows in FIG. 11, five wiring tracks TR19 to TR113 can be provisioned as the wiring tracks that can be laid out optionally.

FIGS. 12A and 12B show a procedure for the layout design. FIGS. 12A and 12B are plan views illustrating the efficiency of the layout design when a line is laid out in the wiring layer M1.

In a step in FIG. 12A, in the wiring layer M1, the lines LI11 and LI19 for connecting the via plugs VI21, VI29 and the via plugs VI11, VI19 (see FIG. 11) are laid out on the wiring track TR11. XY positions of the lines LI11 and LI19 correspond to the XY positions (see FIG. 10) of the end portions of the lines LI31, LI39 in the wiring layer M3. In the wiring layer M1, the lines LO11, LO19 for connecting the via plugs VO21, VO29 and the via plugs VO11, VO19 (see FIG. 11) are laid out on the wiring track TR17. XY positions of the lines LO11 and LO19 correspond to the XY positions (see FIG. 10) of the end portions of the lines LO31, LO39 in the wiring layer M3.

In a step in FIG. 12B, in the wiring layer M1, for example, when a bus wiring having a width of 5 bits is desired to be laid out, five lines LB11 to LB15 can be laid out on the five wiring tracks TR12 to TR16 and extend in a linear manner. That is, compared to the case in which each line LB11 to LB15 is laid out and is stitched between the via plugs, there is no loss of productivity in connection with preparing another track. As such, the layout can be generated with less man-hours, and work efficiency can be improved. Since the lines LB11 to LB15 are laid out in a straight line so that the wiring length can be shortened, total signal delay can be reduced.

Figure 13:
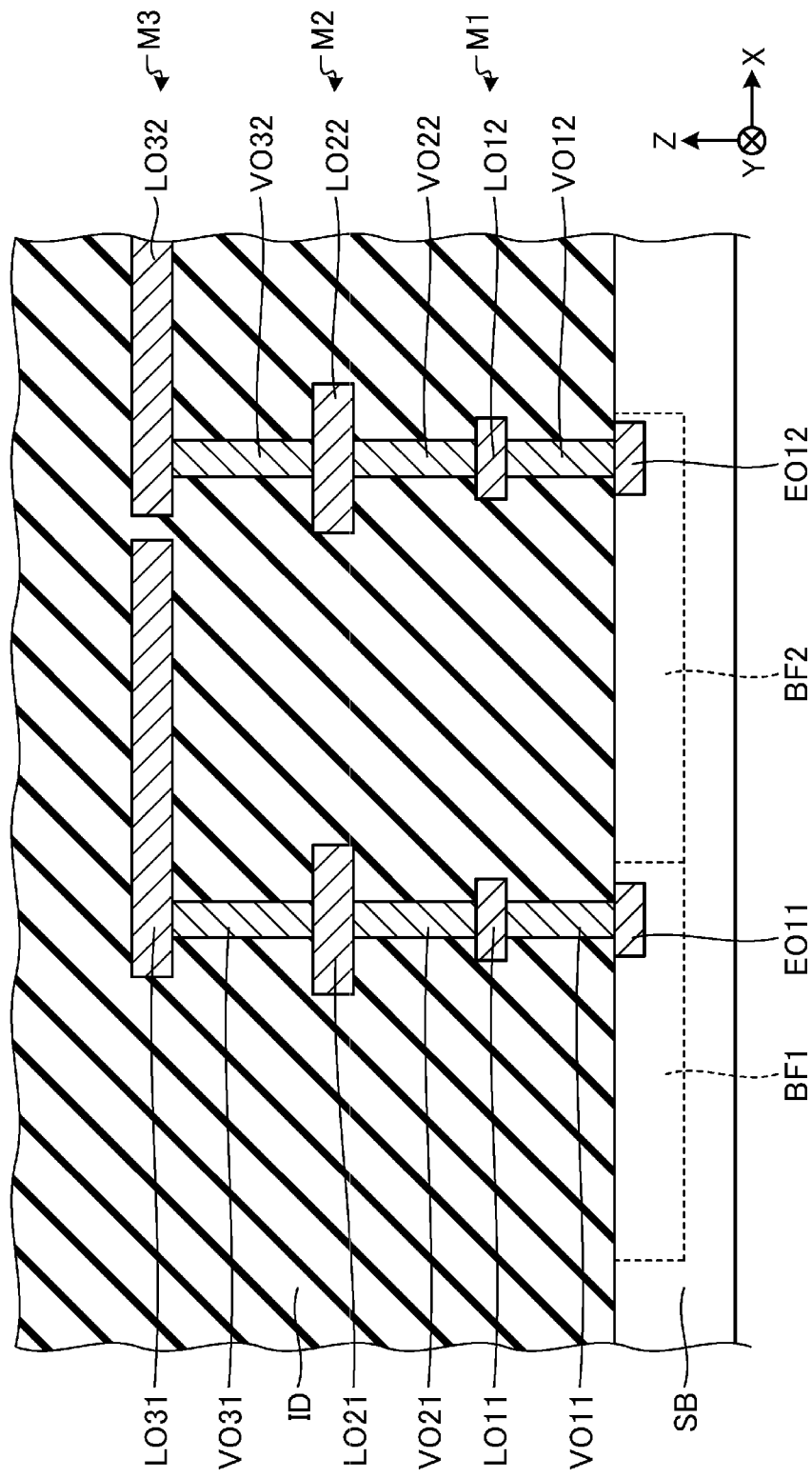
FIG. 13 is a cross-sectional view showing a configuration of the wiring structure of the semiconductor device according to the fifth modification of the embodiment.

The wiring structure WST shown in FIG. 11 is shown in a cross-sectional view as shown in FIG. 13. FIG. 13 is a cross-sectional view showing a configuration of the semiconductor device according to the fifth modification of the embodiment. FIG. 13 illustrates a configuration of the stack via on an output side of the buffers BF1, BF2. In FIG. 13, the lines LB11 to LB15 are not shown for clarity.

The buffer BF1 is formed as an element such as a transistor in the substrate SB and on the substrate SB, and includes an electrode region EO11. The substrate SB can be formed of a material containing a semiconductor (for example, silicon) as a main component. The substrate SB may contain first conductive type (for example, P type) impurities at a first concentration. The electrode region EO11 can be formed as a semiconductor region containing second conductive type (for example, N type) impurities at a second concentration higher than the first concentration in the region where the buffer BF1 is formed on the substrate SB. A surface of the electrode region EO11 is exposed and forms a part of the surface of the substrate SB. The via plug V011 is a columnar or cylindrical member extending in the Z direction. An end portion of the via plug VO11 on the −Z side is electrically connected to the electrode EO11, and an end portion of the via plug VO11 on the +Z side is electrically connected to the line LO11. The via plug VO11 may be formed of a material containing a metal such as tungsten as a main component. The line LO11 is provided in the wiring layer M1 and extends in the Y direction. A surface of the line LO11 on the −Z side is in contact with the via plug VO11 and a surface of the line LO11 on the +Z side is in contact with the via plug VO21. The line LO11 may be formed of a material containing a metal such as aluminum or copper as a main component. The via plug VO21 is a columnar or cylindrical member extending in the Z direction. An end portion of the via plug VO21 on the −Z side is electrically connected to the line LO11, and an end portion of the via plug VO21 on the +Z side is electrically connected to the line LO21. The via plug VO21 may be formed of a material containing a metal such as tungsten as a main component. The line LO21 is provided in the wiring layer M2 and extends in the X direction. A surface of the line LO21 on the −Z side is in contact with the via plug VO21 and a surface of the line LO21 on the +Z side is in contact with the via plug VO31. The line LO21 may be formed of a material containing a metal such as aluminum or copper as a main component. The via plug VO31 is a columnar or cylindrical member extending in the Z direction. An end portion of the via plug VO31 on the −Z side is electrically connected to the line LO21, and an end portion of the via plug VO31 on the +Z side is electrically connected to the line LO31. The via plug VO31 may be formed of a material containing a metal such as tungsten as a main component. The line LO31 is provided in the wiring layer M3 and extends in the X direction. A surface of the line LO31 on the −Z side is in contact with the via plug VO31. The line LO31 may be formed of a material containing a metal such as aluminum or copper as a main component. That is, on the +Z side of the electrode EO11, the stack via, in which the via plug VO11, the line LO11, the via plug VO21, the line LO21, the via plug VO31, and the line LO31 are stacked in this order, is provided. A periphery of the stack via is filled with an interlayer insulating film ID.

The buffer BF2 is formed as an element such as a transistor in the substrate SB and on the substrate SB, and includes an electrode region EO12. The substrate SB can be formed of a material containing a semiconductor (for example, silicon) as a main component. The substrate SB may contain the first conductive type (for example, P type) impurities at the first concentration. The electrode region EO12 can be formed as a semiconductor region containing the second conductive type (for example, N type) impurities at the second concentration higher than the first concentration in the region where the buffer BF2 is formed on the substrate SB. A surface of the electrode region EO12 is exposed and forms a part of the surface of the substrate SB. The via plug VO12 is a columnar or cylindrical member extending in the Z direction. An end portion of the via plug VO12 on the −Z side is electrically connected to the electrode EO12, and an end portion of the via plug VO12 on the +Z side is electrically connected to the line LO12. The via plug VO12 may be formed of a material containing a metal such as tungsten as a main component. The line LO12 is provided in the wiring layer M1 and extends in the Y direction. A surface of the line LO12 on the −Z side is in contact with the via plug VO12 and a surface of the line LO12 on the +Z side is in contact with the via plug VO22. The line LO12 may be formed of a material containing a metal such as aluminum or copper as a main component. The via plug VO22 is a columnar or cylindrical member extending in the Z direction. An end portion of the via plug VO22 on the −Z side is electrically connected to the line LO12, and an end portion of the via plug VO22 on the +Z side is electrically connected to the line LO22. The via plug VO22 may be formed of a material containing a metal such as tungsten as a main component. The line LO22 is provided in the wiring layer M2 and extends in the X direction. A surface of the line LO22 on the −Z side is in contact with the via plug VO22 and a surface of the line LO22 on the +Z side is in contact with the via plug VO32. The line LO22 may be formed of a material containing a metal such as aluminum or copper as a main component. The via plug VO32 is a columnar or cylindrical member extending in the Z direction. An end portion of the via plug VO32 on the −Z side is electrically connected to the line LO22, and an end portion of the via plug VO32 on the +Z side is electrically connected to the line LO32. The via plug VO32 may be formed of a material containing a metal such as tungsten as a main component. The line LO32 is provided in the wiring layer M3 and extends in the X direction. A surface of the line LO32 on the −Z side is in contact with the via plug VO32. The line LO32 may be formed of a material containing a metal such as aluminum or copper as a main component. That is, on the +Z side of the electrode EO12, the stack via in which the via plug VO12, the line LO12, the via plug VO22, the line LO22, the via plug VO32, and the line LO32 are stacked in this order, is provided. The periphery of the stack via is filled with the interlayer insulating film ID.

The wiring structure WST according to the embodiment and the first to fifth modifications may be applied to, for example, a semiconductor device as shown in FIGS. 14A and 14B. FIGS. 14A and 14B are diagrams showing a configuration of the semiconductor device 1 of the embodiment.

The semiconductor device 1 shown in FIG. 14A includes a core portion 2 and a peripheral circuit unit 3. The core portion 2 includes, for example, 16 plain PLNs (PLN0 to PLN15). Each plane PLN includes a plurality of memory cell transistors. The peripheral circuit unit 3 includes a first latch circuit 11a, a second latch circuit 11b, a serial/parallel conversion circuit 12, a chip control circuit 13, an input and output circuit 15, and a logic control circuit 18.

The first latch circuit 11a is connected to planes PLN0, PLN1, PLN4, PLN5, PLN8, PLN9, PLN12, PLN13 via a data path DP1, and is connected to the serial/parallel conversion circuit 12 and the second latch circuit 11b via a main data bus MDB.

The second latch circuit 11b is connected to planes PLN2, PLN3, PLN6, PLN7, PLN10, PLN11, PLN14, PLN15 via a data path DP2, and is connected to the serial/parallel conversion circuit 12 and the first latch circuit 11a via the main data bus MDB.

For example, signals read from the memory cell transistors via the data paths DP1, DP2 are latched by the first latch circuit 11a and the second latch circuit 11b, and the latched signals are output to an external controller (not shown) through the main data bus MDB, the serial/parallel conversion circuit 12, and the input and output circuit 15.

Signals to be written are latched by the first latch circuit 11a and the second latch circuit 11b from the external controller (not shown) via the input the output circuit 15, the serial/parallel conversion circuit 12, and the main data bus MDB, and the latched signals are written to the memory cell transistors via the data paths DP1, DP2.

FIG. 14B shows in detail a connection portion between the main data bus MDB connecting the first latch circuit 11a and the second latch circuit 11b and the serial/parallel conversion circuit 12.

For example, the wiring structure WST according to the embodiment and the first to fifth modifications can be applied to a portion surrounded by dotted lines in FIG. 14B. Lines corresponding to the wiring layer M3 are shown in the portion surrounded by the dotted lines in FIG. 14B, and lines corresponding to the wiring layers M2, M1 below the lines corresponding to the wiring layer M3 are not shown. By applying the layout configuration of the wiring structure WST according to the embodiment and the first to fifth modifications to the layout configuration of the portion surrounded by the dotted lines in FIG. 14B, a layout area of the portion surrounded by the dotted lines in FIG. 14B can be easily reduced.

The wiring structure WST according to the embodiment and the first to fifth modifications can be applied to a portion surrounded by dashed-dotted lines in FIG. 14B. Lines corresponding to the wiring layer M3 are shown in the portion surrounded by the dashed-dotted lines in FIG. 14B, and lines corresponding to the wiring layers M2, M1 below the lines corresponding to the wiring layer M3 are not shown. A bidirectional buffer circuit DBF corresponding to the buffer BF is shown at a portion surrounded by the dashed-dotted lines in FIG. 14B. By applying the layout configuration of the wiring structure WST according to the embodiment and the first to fifth modifications to the layout configuration of the portion surrounded by the dashed-dotted lines in FIG. 14B, a layout area of the portion surrounded by the dashed-dotted lines in FIG. 14B can be easily reduced.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
   a first circuit;
   a second circuit;
   a wiring structure connected to the first circuit and the second circuit, the wiring structure including:
      a first outer track extending in a first direction;
      a second outer track extending in the first direction;
      a plurality of inner tracks which are disposed between the first outer track and the second outer track and extending in the first direction; and
      a plurality of wirings, each of which has a stepwise pattern at the inner tracks or extends obliquely with respect to the inner tracks, and has an end portion at the first outer track or the second outer track, wherein
   the plurality of wirings includes a first line laid out along the first outer track and having an end portion that is laid out along the second outer track and a second line laid out along the second outer track and having an end portion that is laid out along the first outer track.

2. The semiconductor device according to claim 1, wherein
   the first line includes a main portion that is laid out along the first outer track, an end portion that is laid out along the second outer track, and a connection portion that has the stepwise pattern between the main portion of the first line and the end portion of the first line, and
   the second line includes a main portion that is laid out along the second outer track, an end portion that is laid out along the first outer track, and a connection portion that has the stepwise pattern between the main portion of the second line and the end portion of the second line.

3. The semiconductor device according to claim 2, wherein
   the inner tracks include a first inner track, and
   the plurality of wirings includes a third line that is laid out along the first inner track and an end portion that is laid out along the first outer track, and a fourth line that is laid out along the first inner track and an end portion that is laid out along the second outer track.

4. The semiconductor device according to claim 2, wherein a first wiring layer of the wiring structure includes the plurality of wirings and the wiring structure further includes:
   a second wiring layer between the first wiring layer and a semiconductor substrate;
   a plurality of via plugs respectively in contact with the end portions of the wirings and extending between the first wiring layer and the second wiring layer.

5. The semiconductor device according to claim 2, wherein
   the first line includes a main portion that is laid out along the first outer track, an end portion that is laid out along the second outer track, and a connection portion that extends obliquely with respect to the inner tracks between the main portion of the first line and the end portion of the first line, and
   the second line includes a main portion that is laid out along the second outer track, an end portion that is laid out along the first outer track, and a connection portion that extends obliquely with respect to the inner tracks between the main portion of the second line and the end portion of the second line.

6. The semiconductor device according to claim 5, wherein the inner tracks include a first inner track, and the plurality of wirings includes a third line that is laid out along the first inner track and an end portion that is laid out along the first outer track, and a fourth line that is laid out along the first inner track and an end portion that is laid out along the second outer track.

7. The semiconductor device according to claim 5, wherein a first wiring layer of the wiring structure includes the plurality of wirings and the wiring structure further includes:

a second wiring layer between the first wiring layer and a semiconductor substrate;

a plurality of via plugs respectively in contact with the end portions of the wirings and extending between the first wiring layer and the second wiring layer.

8. The semiconductor device according to claim 2, further comprising:

a bidirectional buffer circuit electrically connected between the first line and the second line.

9. A semiconductor device comprising:

a first circuit;

a second circuit;

a wiring structure connected to the first circuit and the second circuit, the wiring structure including:

a first outer track extending in a first direction;

a second outer track extending in the first direction;

a plurality of inner tracks which are disposed between the first outer track and the second outer track and extending in the first direction;

a plurality of first wirings, each of which has an end portion at the first outer track, and one of which has a main portion that is laid out along the second outer track and a connection portion between the main portion thereof and the end portion thereof that has a stepwise pattern at the inner tracks or extends obliquely with respect to the inner tracks; and a plurality of second wirings, each of which has an end portion at the second outer track and one of which has a main portion that is laid out along the first outer track and a connection portion between the main portion thereof and the end portion thereof that has a stepwise pattern at the inner tracks or extends obliquely with respect to the inner tracks.

10. The semiconductor device according to claim 9, wherein the wiring structure further includes:

a plurality of third wirings, each of which has an end portion at one of the inner tracks.

11. The semiconductor device according to claim 10, wherein the third wirings include:

a first line having a main portion that is laid out long the second outer track and a connection portion between the main portion thereof and the end portion thereof that has a stepwise pattern at the inner tracks, and a second line having a main portion that is laid out long the first outer track and a connection portion between the main portion thereof and the end portion thereof that has a stepwise pattern at the inner tracks.

12. The semiconductor device according to claim 11, wherein the inner tracks include a first inner track adjacent to the first outer track and a second inner track adjacent to the second outer track, and the end portion of the first line is laid out along the first inner track, and the end portion of the second line is laid out along the second inner track.

13. The semiconductor device according to claim 12, wherein a first wiring layer of the wiring structure includes the plurality of first, second, and third wirings and the wiring structure further includes:

a second wiring layer between the first wiring layer and a semiconductor substrate;

a plurality of via plugs respectively in contact with the end portions of the wirings and extending between the first wiring layer and the second wiring layer.

14. The semiconductor device according to claim 9, further comprising:

a bidirectional buffer circuit electrically connected between one of the first wirings and one of the second wirings.

* * * * *